US008541768B2

(12) United States Patent
Shima et al.

(10) Patent No.: US 8,541,768 B2
(45) Date of Patent: Sep. 24, 2013

(54) SEMICONDUCTOR DEVICE HAVING STACKED STRUCTURAL BODIES AND METHOD FOR MANUFACTURING THE SAME

(75) Inventors: Akio Shima, Hino (JP); Yoshitska Sasago, Tachikawa (JP); Toshiyuki Mine, Fussa (JP); Masaharu Kinoshita, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 43 days.

(21) Appl. No.: 13/118,402

(22) Filed: May 28, 2011

(65) Prior Publication Data
US 2011/0297911 A1 Dec. 8, 2011

(30) Foreign Application Priority Data

Jun. 2, 2010 (JP) ................................. 2010-126983

(51) Int. Cl.
*H01L 29/02* (2006.01)
(52) U.S. Cl.
USPC ..... 257/4; 257/2; 257/3; 257/5; 257/E29.002; 438/102; 438/103; 438/104; 365/163
(58) Field of Classification Search
USPC ......... 257/1–5, E29, E29.002; 438/102–104; 365/148, 163
See application file for complete search history.

(56) References Cited

U.S. PATENT DOCUMENTS

| 2003/0067013 | A1 | 4/2003 | Ichihara et al. |
| 2004/0174732 | A1 | 9/2004 | Morimoto |
| 2005/0095755 | A1 | 5/2005 | Nakata et al. |
| 2005/0201182 | A1 | 9/2005 | Osada et al. |
| 2009/0267047 | A1* | 10/2009 | Sasago et al. ..................... 257/4 |
| 2010/0182828 | A1 | 7/2010 | Shima et al. |

FOREIGN PATENT DOCUMENTS

| JP | 2003-100085 A | 4/2003 |
| JP | 2004-272975 A | 9/2004 |
| JP | 2005-136213 A | 5/2005 |
| JP | 2005-260014 A | 9/2005 |

* cited by examiner

*Primary Examiner* — Jami M Valentine
(74) *Attorney, Agent, or Firm* — Miles & Stockbridge P.C.

(57) ABSTRACT

A technique used for a semiconductor device formed by stacking multiple structural bodies each having a semiconductor device, for preventing generation of thermal load on a structural body at a lower layer which is caused by a laser used in a step of forming a structural body at an upper layer. In a phase-change memory including multiple stacked memory matrices, a metal film is disposed between a memory matrix at a lower layer and a memory matrix at an upper layer formed over the memory matrix at the lower layer, in which the laser used for forming the memory matrix is reflected at the metal film and prevented from transmitting the metal film, thereby preventing the phase-change material layer, etc. in the memory matrix at the lower layer from being directly heated excessively by the laser.

8 Claims, 32 Drawing Sheets

SEMICONDUCTOR DEVICE HAVING STACKED STRUCTURAL BODIES AND METHOD FOR MANUFACTURING THE SAME

CLAIM OF PRIORITY

The present application claims priority from Japanese patent application JP 2010-126983 filed on Jun. 2, 2010, the content of which is hereby incorporated by reference into this application.

FIELD OF THE INVENTION

The present invention relates to a semiconductor device and a method for manufacturing the same and particularly to a semiconductor device having a structure of stacking layers each containing a semiconductor device as well as a technique which is effectively applied to the manufacture of the semiconductor device.

BACKGROUND OF THE INVENTION

In recent years, in the manufacturing process of semiconductor device having a logic circuit or a non-volatile memory, a heating system using a laser has been used frequently instead of a heating system such as a lamp system used so far when heating the semiconductor device during a manufacturing process. Since laser annealing can apply a heat treatment at a high temperature in a short time and can prevent exposure of regions other than the target region for heating to a high temperature for a long time, it has advantages capable of decreasing damages to the semiconductor device due to heat and capable of improving the reliability of the device.

Laser annealing is used, for example, in a step of crystallizing an amorphous silicon film in an amorphous state by a heat treatment and forming a polysilicon film comprised of the amorphous silicon film in the manufacturing process of a phase-change random access memory (PRAM) by using a phase-change material such as a chalcogenide. Further, laser annealing is used also in a step of activating impurity in an impurity diffusion layer. Laser annealing is used instead of the lamp type heat treatment for preventing regions other than the region requiring a heat treatment in a PRAM from undergoing thermal loads.

The phase-change random access memory (hereinafter referred to as a phase-change memory) is a memory device of performing rewriting electrically by flowing a current to a phase-change material layer put between metal electrodes while utilizing the property of the phase-change material that an electric resistance is different by the order of several digits between an amorphous state and a crystalline state. A basic memory cell structure of the phase-change memory is a structure of combining a storage device (phase-change material layer) and a selection device.

Further, it is expected that the phase-change memory can perform write and read operations at a high speed substantially identical with that of dynamic random access memory (DRAM) although this memory is non-volatile, and since the cell area can be decreased to a level substantially identical with a flash memory, this is considered prospective as a next generation non-volatile memory.

Japanese Unexamined Patent Application Publication No. 2003-100085 disclosed a phase-change memory having a diode as a selection device.

Further, as a method of highly integrating a non-volatile memory that utilizes a resistance-change type device, Japanese Unexamined Patent Application Publication No. 2004-272975 discloses a memory array in which multiple memory cells having a transistor as a selection device for selecting a predetermined memory cell and a resistance-change type device connected in parallel are connected in series. Further, the capacity of the resistance-change type memory cell can be increased by stacking memory cells in multilayer as disclosed in Japanese Unexamined Patent Application Publication No. 2005-260014.

Further, Japanese Unexamined Patent Application Publication No. 2005-136213 describes a technique capable of suppressing abnormal operation of a thin film transistor (TFT) device formed by laser annealing and capable of separating a substrate and a device in a short time. In this technique, a heat insulating film comprised of a porous silicon oxide film having multiple gaps is disposed between a glass substrate and a TFT device on a glass substrate and the amorphous semiconductor layer forming a TFT device is crystallized by annealing at a high temperature for a long time by an excimer laser thereby forming a device of large carrier mobility. Japanese Unexamined Patent Application Publication No. 2005-136213 describes that a TFT device can be prevented from causing abnormal operation due to heat during operation by removing the heat insulating film after the annealing step for crystallization described above. However, the heat insulating film described therein is a silicon oxide film which is disposed with an aim of keeping a high temperature and this is not for preventing the layer below the heat insulating film from being heated by the laser. Further, the technique disclosed in Japanese Unexamined Patent Application Publication No. 2005-136213 is applied, for example, to a thin film transistor over a glass substrate and it contains no description of applying the same to a non-volatile memory or a logic circuit, etc.

SUMMARY OF THE INVENTION

After the generation of 32 nm design rule, a memory for data storage is necessary instead of a flash memory. Decrease in the cost which is the most important subject of the data storage memory can be attained by forming a memory in a three-dimensional form as described in Japanese Unexamined Patent Application Publication No. 2005-260014. That is, decrease in the cost and increase in the capacity of the memory can be attained by stacking memories.

Further, while a transistor may be used as a selection device for the phase-change memory, a memory array using a diode as the selection device and arranging a serial structure of a diode and a phase-change material layer of a cross-point-type is most prospective in view of the refinement of the cell.

For example, the diode as the selection device preferably comprises a polysilicon film and, in the step of forming the polysilicon film, a method of forming a polysilicon film by crystallization by heat treating an amorphous silicon film may be considered. In this case, a method of applying a heat treatment by using laser annealing is considered with an aim of decreasing thermal load on the phase-change memory.

While the laser annealing can perform a heat treatment at a high temperature in a short time, there may be a problem that a laser transmitting a layer to be subjected to the heat treatment may heat a heat feasible device at the lower layer thereby causing damages.

Particularly, in a phase-change memory where memory cell arrays are stacked, since the phase-change material layer as a resistance variable device is melted or sublimes at such a high temperature as the crystallizing temperature for amorphous silicon, there may be a possibility that the phase-change memory no more operates normally.

Further, not being restricted to the phase-change memory, in a semiconductor device having a stacked structure in which a device, for example, a complementary metal insulator semiconductor field effect transistor (CMISFET) is stacked, the characteristic of a high-k insulating film or a silicide layer as a constituent of CMISFET may possibly be degraded when exposed to such a high temperature as a crystallizing temperature for amorphous silicon or an activating temperature for an impurity diffusion layer as a source-drain region. Accordingly, in a case of performing the laser annealing in the step of forming the CMISFET at an upper layer of the semiconductor device having the stacked structure, when a laser light hits directly against the high-k insulating film or the silicide at a lower layer as a constituent of the CMISFET, the characteristic of the high-k insulating film or the silicide layer is denatured by the high temperature and it may be a possibility that the semiconductor device no more operates normally.

The present invention intends to improve the reliability of a semiconductor device. Particularly, in the step of manufacturing a semiconductor device formed by stacking structures each having a semiconductor device in plurality of layers, thermal load on the semiconductor device due to the laser is decreased.

The foregoing, as well as other objects and novel features of the present invention will become apparent in view of the description of the present specification and the accompanying drawings.

The outline of typical inventions among those disclosed in the present application is to be described briefly as below.

A semiconductor device in accordance with one aspect of the invention includes:

a first structure having a first semiconductor device formed in a first region of a semiconductor substrate, a metal film formed over the first structure being insulated from the first semiconductor device, a second structure having a second semiconductor device formed over the metal film while being insulated from the metal film, a third structure having a third semiconductor device formed in a second region of the semiconductor substrate and insulated from the metal film, and a first connection member and a second connection member for electrically connecting the first semiconductor device and the second semiconductor device and the third structure respectively in which the metal film has a thermal conductivity lower than that of the first connection portion and the second connection portion.

Further, a method for manufacturing a semiconductor device in accordance with another aspect of the present application includes the steps of:

(a) forming a first structure having a first semiconductor device over a semiconductor substrate, (b) forming a first metal film insulated from the semiconductor device over the first structure so as to overlap the first semiconductor device in view of a plane, and (c) forming a second structure having a second semiconductor device insulated from the first metal film over the first metal film, in which a heat treatment is performed by a laser when forming the second semiconductor device in the step (c).

The effects obtained by typical inventions among those disclosed in the present application are to be described briefly as below.

According to the invention, the reliability of the semiconductor device can be improved.

DETAILED DESCRIPTION OF THE PREFERRED EMBODIMENTS

Figure 1:
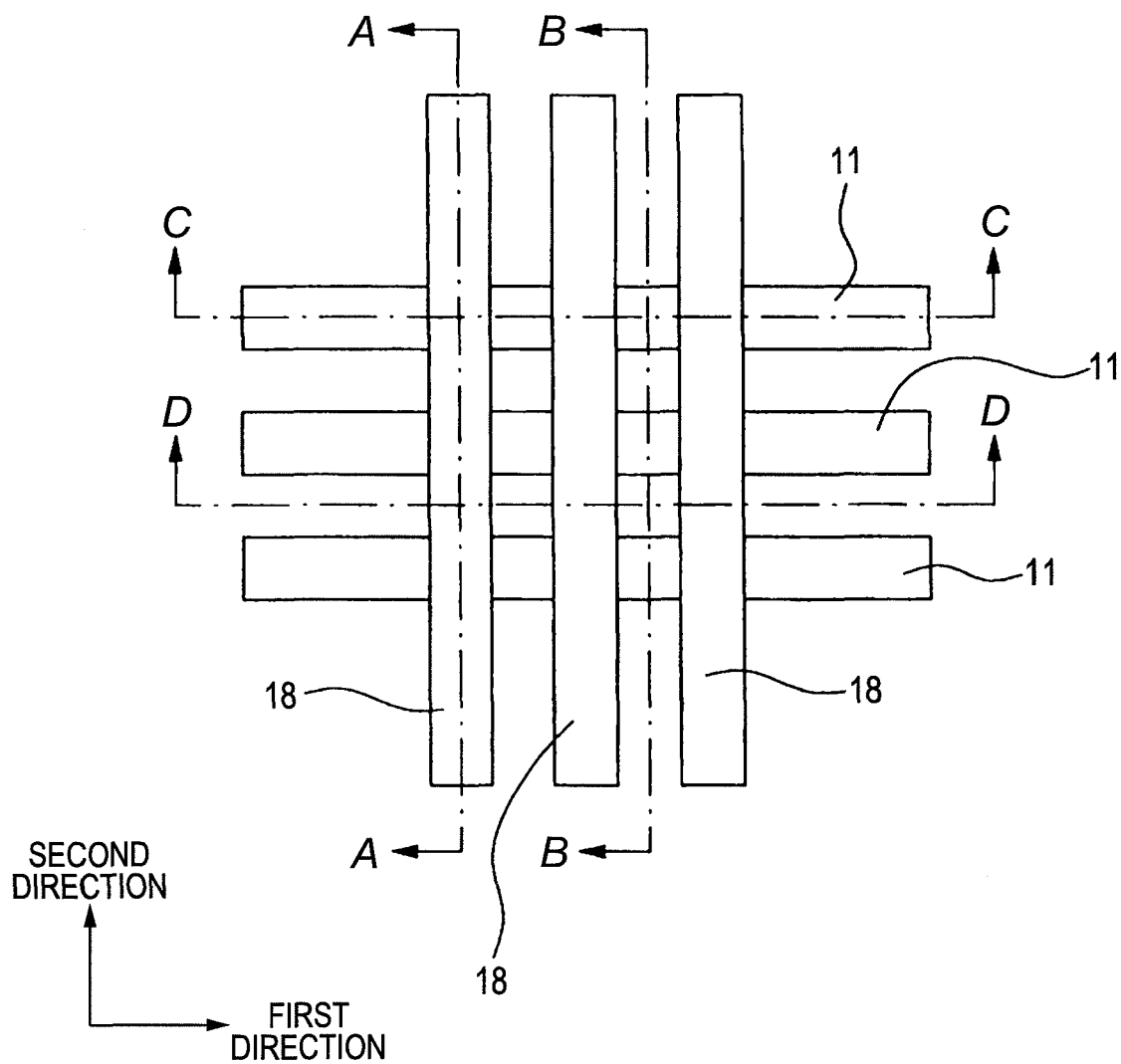
FIG. 1 is a plan view of a phase-change memory as a first embodiment of the invention.

Preferred embodiments of the invention are to be described specifically with reference to the drawings.

Throughout the drawings for explaining preferred embodiments, components having identical functions carry the same reference numerals for which duplicate description is to be omitted. In the following embodiments, descriptions for identical or similar portions are not repeated as a rule.

Further, in the drawings used for the following embodiments, hatchings may be sometimes omitted partially even for cross sectional views for making the drawings easy to see.

Further, in the drawings used for the following embodiments, hatchings may be sometimes attached partially even for plan views for making the drawings easy to see.

First Embodiment

In this embodiment, description is to be made to a semiconductor device having a cross-point-type memory matrix where multiple self-aligned memory cells are formed in perpendicular to intersections between bit lines and word lines, having a diode as a selection device, and having a phase-change memory as a storage device.

Figure 6:
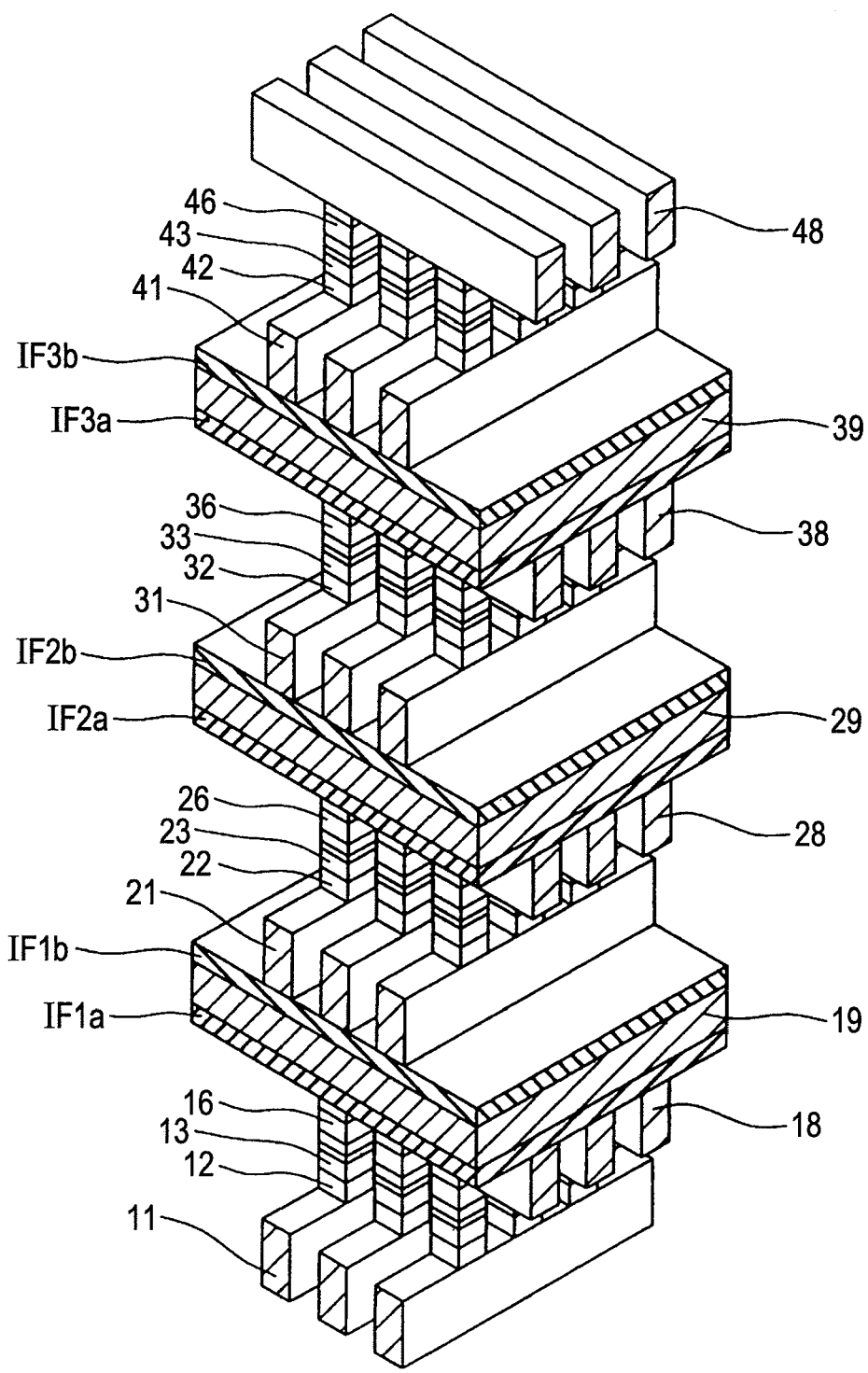
FIG. 6 is a perspective view of a phase-change memory as the first embodiment of the invention.

At first, FIG. 1 to FIG. 6 show a portion of a cross sectional view of a phase-change memory in this embodiment. FIG. 1 is a plan view of a phase-change memory of this embodiment and shows a structure in which multiple bit lines 18 extending in a stripe shape in a second direction perpendicular to a first direction are formed in a layer above multiple word lines 11 extending in a stripe shape in the first direction. In FIG. 1, only the word lines 11 and the bit liens 18 are shown for easy understanding of the drawing. FIG. 2, FIG. 3, FIG. 4, and FIG. 5 are cross sectional views for main portions along lines A-A, B-B, C-C, and D-D in FIG. 1. FIG. 6 is a perspective view showing a memory array of phase-change memories shown in FIG. 1 to FIG. 5.

Figure 2:
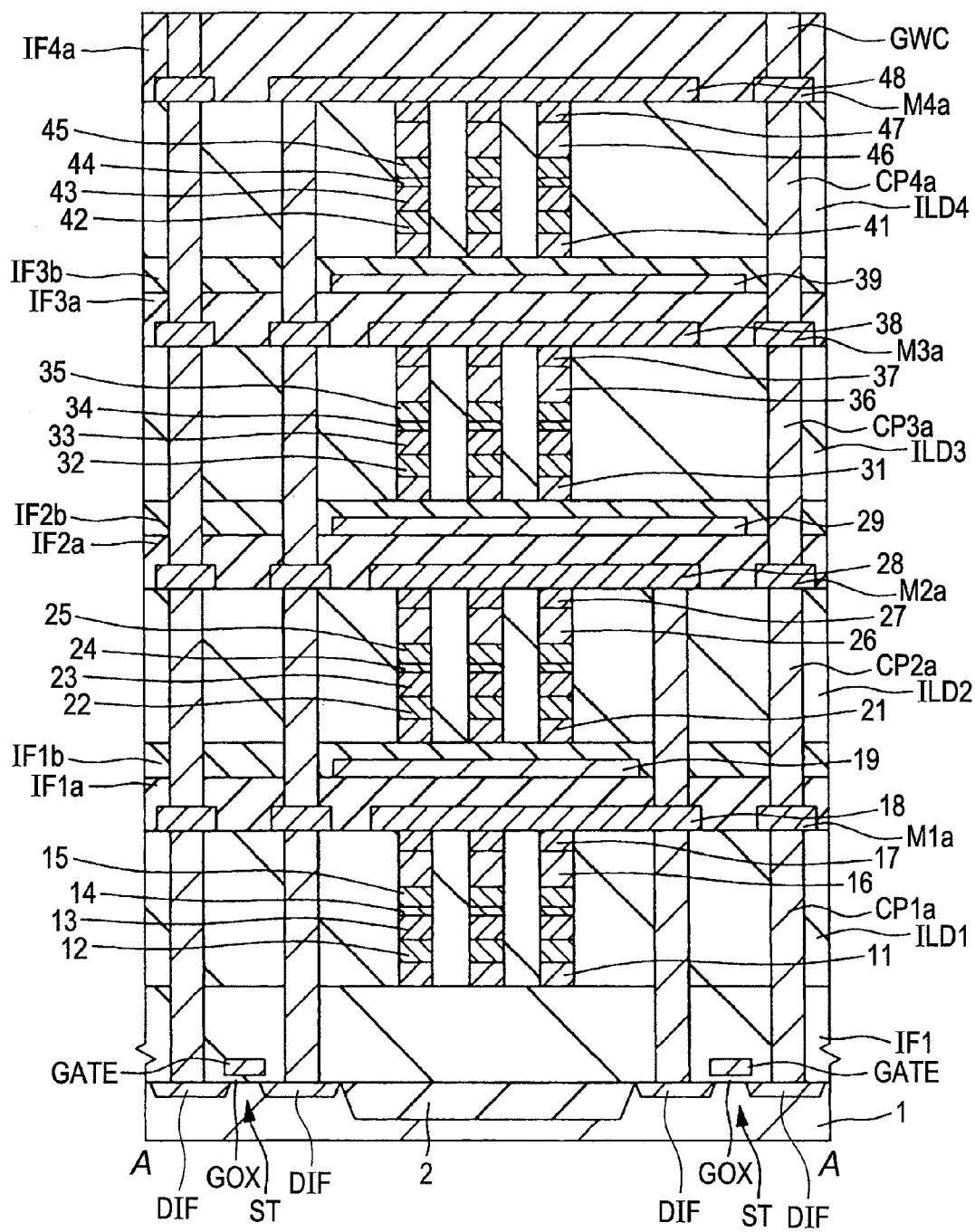
FIG. 2 is a cross sectional view for a main portion along line A-A in FIG. 1.
Figure 3:
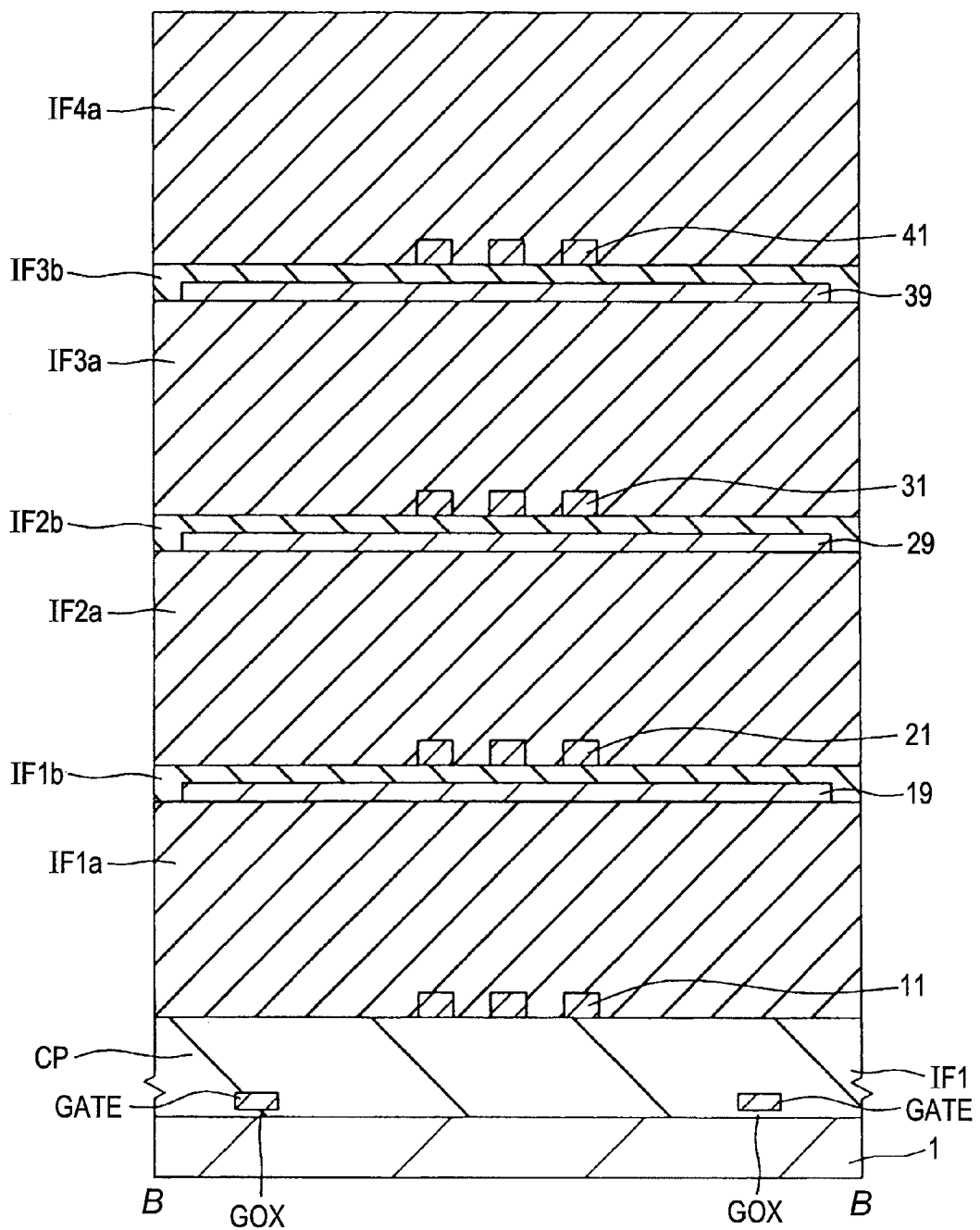
FIG. 3 is a cross sectional view for a main portion along line B-B in FIG. 1.

As shown in FIG. 2 to FIG. 5, gate electrodes GATE are formed by way of a gate insulating film GOX over a semiconductor substrate 1, a pair of diffusion layers DIF are formed to the upper surface of the semiconductor substrate 1 so as to sandwich a portion of the semiconductor substrate 1 below the gate electrodes GATE, and the diffusion layer DIF and the gate electrode GATE configure a field effect transistor (MOSFET: Metal Oxide Semiconductor Field Effect Transistor) ST for selecting word lines 11, 21, 31, on 41 and bit liens 18, 28, 38, and 48. A device isolation layer 2 is formed adjacent with the diffusion layers DIF in the upper surface of the semiconductor substrate 1, an interlayer insulating film IF1 is formed over the semiconductor substrate 1 so as to cover the gate electrode GATE and the device isolation layer 2 and, as shown in FIG. 2, interlayer insulation films ILD1, IF1a, IF1b, ILD2, IF2a, IF2b, ILD3, IF3a, IF3b, ILD4, and IF4a are formed successively above the interlayer insulating film IF1 from the side of the semiconductor substrate 1.

Above the interlayer insulating film IF1, a stacked structure formed by stacking a word line 11, a p-type layer 12, an n-type layer 13, a silicide layer 14, a lower electrode 15, a phase-change material layer 16, and an upper electrode 17 successively is formed in a layer identical with the interlayer insulating film ILD1. The word lines 11 are extended in the first direction along the main surface of the semiconductor substrate 1, and they are formed in plurality in a row over the main surface of the semiconductor substrate 1 in a second direction perpendicular to the first direction. Further, a bit line 18 extending in a stripe shape in a second direction is formed over the interlayer insulating film ILD1, and electrically connected with an upper electrode 17. An interconnect layer M1a is formed in a layer identical with the bit line 18, and the interconnect layer M1a is electrically connected with the diffusion layer DIF by way of a contact plug CP1a passing through the interlayer insulation film ILD1 and the interlayer insulating film IF1. The p-type layer 12, the n-type layer 13, the silicide layer 14, the lower electrode 15, the phase-change material layer 16, and the upper electrode 17 have a laminated columnar structure, and the laminated structures are formed in plurality in a row over the word lines 11. That is, since the word lines 11 and the bit lines 18 are formed in plurality in the stripe shape, multiple memory cells including the p-type layer 12, n-type layer 13, the silicide layer 14, the lower electrode 15, the phase-change material layer 16, and the upper electrode 17 are formed to multiple intersections where the word lines 11 and the bit lines 18 intersect in view of a plane, and arranged in a matrix. A memory matrix including the p-type layer 12, the n-type layer 13, the silicide layer 14, the lower electrode 15, the phage-change material layer 16, and the upper electrode 17 is referred to herein as a memory matrix at the first layer.

As shown in FIG. 2, an interconnect layer M1a formed in a layer identical with the bit line 18 and an interlayer insulating film IF1a covering the bit line 18 and the interconnect layer M1a are formed over the interlayer insulating film ILD1. A metal layer 19 and an interlayer insulating film IF1b covering the metal film 19 are formed over the interlayer insulating film IF1a. The metal film 19 is formed above multiple memory cells each including the p-type layer 12, the n-type layer 13, the silicide layer 14, the lower electrode 15, the phase-change material layer 16, and the upper electrode 17 and arranged so as to overlap each of the memory cells in view of a plane.

A word line 21, a p-type layer 22, an n-type layer 23, a silicide layer 24, a lower electrode 25, a phase-change material layer 26, and an upper electrode 27 are formed in a layer identical with an interlayer insulating film ILD2 over the interlayer insulating film IF1b in the same manners as the word line 11, the p-type layer 12, the n-type layer 13, the silicide layer 14, the lower electrode 15, the phase-change material layer 16, and the upper electrode 17 formed in the layer identical with the interlayer insulating film ILD1. Multiple memory cells including the p-type layer 22, the n-type layer 23, the silicide layer 24, the lower electrode 25, the phase-change material layer 26, and the upper electrode 27 are arranged in a matrix and connected at an upper portion with a bit line 28 in the same manner as the p-type layer 12, the n-type layer 13, the silicide layer 14, the lower electrode 15, the phase-change material layer 16, and the upper electrode 17.

An interlayer insulating film IF2a is formed so as to cover the bit line 28 and an interconnect layer M2a in the same manner as the interlayer insulating film IF1a, and a metal film 29 and an interlayer insulating film IF2b covering the metal film 29 are formed over the interlayer insulating film IF2a. In the same manner as the metal film 19, the metal film 29 is formed so as to overlap the memory cells including the p-type layer 22, the n-type layer 23, the silicide layer 24, the lower electrode 25, the phase-change material layer 26, and the upper electrode 27 in view of a plane.

As described above, in the semiconductor device of this embodiment, a metal film is formed between each of the stacked memory cells, the memory matrix at the third layer and the memory matrix at the fourth layer are formed over the interlayer insulating film IF2b and over the interlayer insulating film IF3b respectively in the same manner, and a metal film 39 is formed between the memory matrix at the third layer and the memory matrix at the fourth layer.

As shown in FIG. 2, a bit line 48 is formed over the memory matrix at the fourth layer and the bit line 48 is electrically connected with the diffusion layer DIF of the field effect transistor ST by way of contact plugs CP1a to CP4a, and interconnect layers M1a, M2a, and M3a. Further the bit line 28 is electrically connected with the diffusion layer DIF of the field effect transistor ST by way of the contact plugs CP1a and CP2a and the bit line 18. Further, the diffusion layer DIF not connected with the bit lines 18, 28, 38 and 48 is electrically connected with a global bit line (not illustrated) by way of the contact plugs CP1a to CP4a, GWC, and the interconnect layers M1a to M4a.

Figure 4:
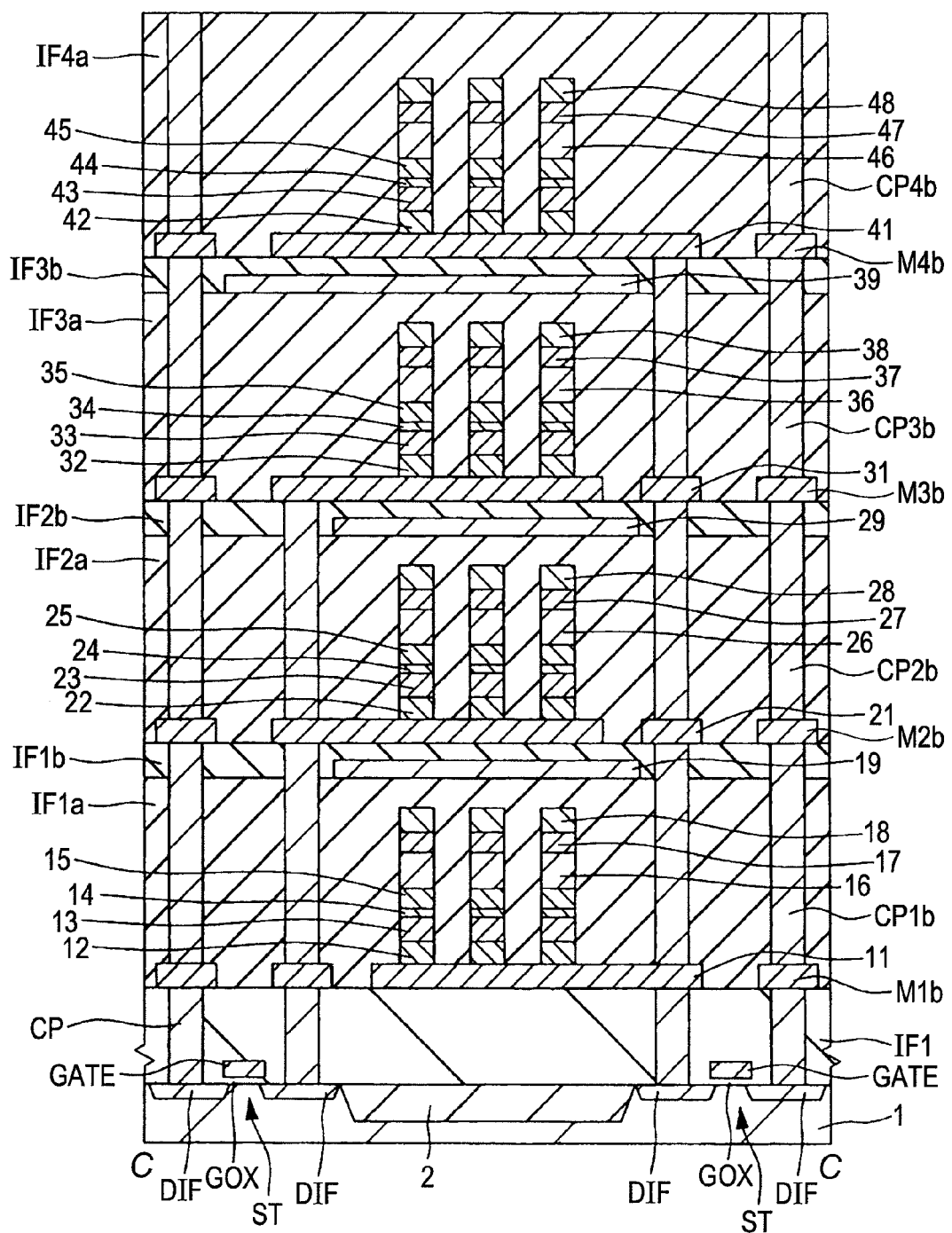
FIG. 4 is a cross sectional view for a main portion along line C-C in FIG. 1.
Figure 5:
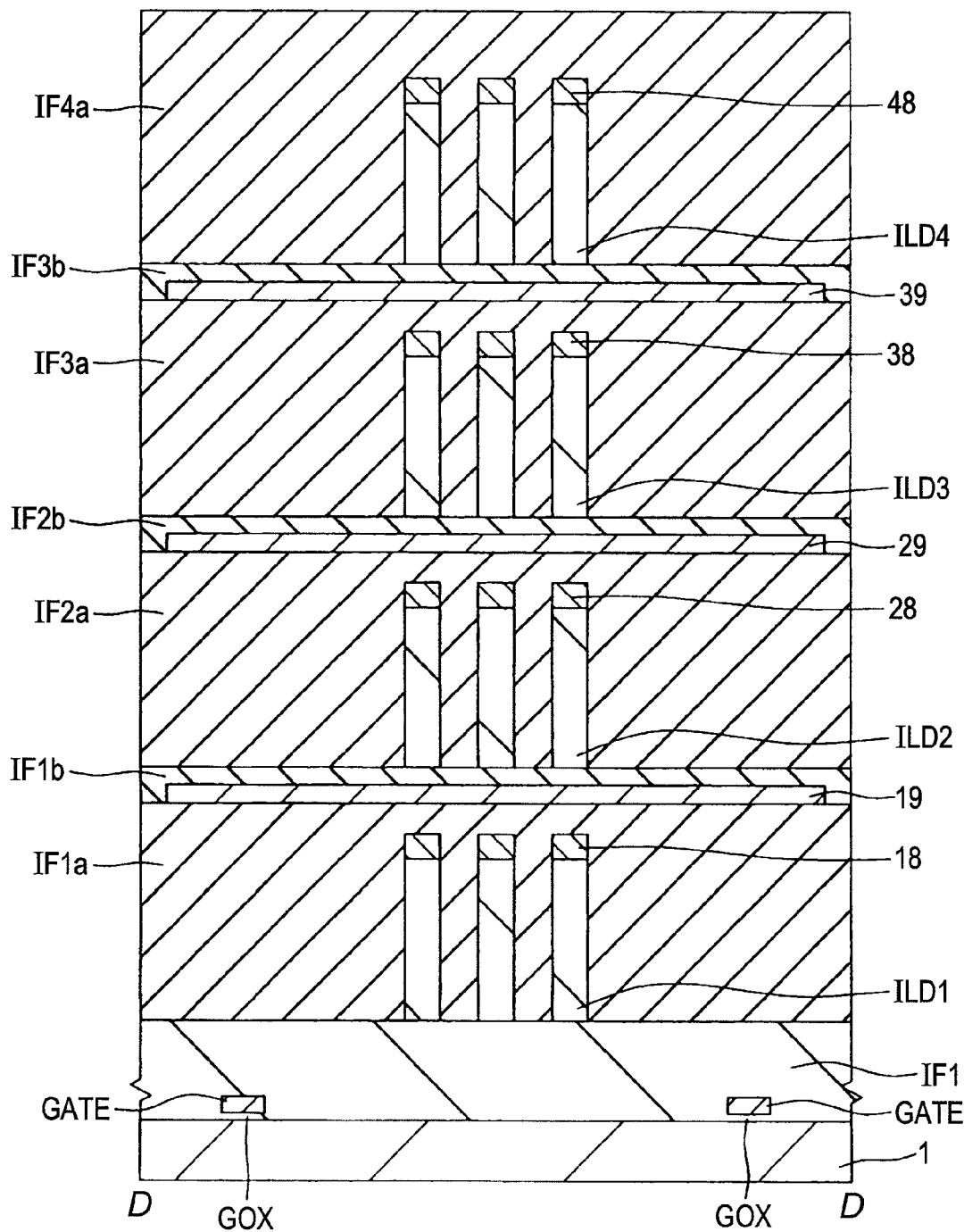
FIG. 5 is a cross sectional view for a main portion along line D-D in FIG. 1.

As shown in FIG. 4, a word line 41 is formed below the memory matrix at the fourth layer, and the word line 41 is electrically connected with the diffusion layer DIF of the field effect transistor ST by way of the contact plugs CP1b to CP3b, the word line 11, the interconnect layer M2b, M3b and the contact plug CP. Further, the word line 31 is electrically connected with the diffusion layer DIF of the field effect transistor ST by way of the contact plugs CP2b, CP1b, CP, and the word lines 11 and 12. Further, the diffusion layer DIF not connected with the word lines 11, 21, 31, and 41 is electrically connected by way of the contact plugs CP, CP1b to CP4b and the interconnect layers Nib to M4b to the global word line (not illustrated).

The word lines 11, 21, 31, and 41, and the bit lines 18, 28, 38, and 48 are interconnects comprised of a metal film mainly made of tungsten, selected by the field effect transistor ST, and supplying a potential to a memory cell for writing, erasing, or reading information. The p-type layers 12, 22, 32, and 42 are, semiconductor layers comprised of polysilicon to which a p-type impurity (for example, B (boron)) is introduced, and the n-type layers 13, 23, 33, and 43 are semiconductor layers comprised of polysilicon to which an n-type impurity (for example, P (phosphorus)) is introduced. The p-type layers 12, 22, 32, and 42, and the n-type layers 13, 23, 33 and 43 configure a polysilicon diode for selecting the memory cell formed thereabove.

The silicide layers 14, 24, 34, and 44 are layers for ohmic contact between the upper portion of the respective n-type layers 13, 23, 33 and 43 and the lower electrodes 15, 25, 35, and 45 comprised of W (tungsten) or TiN (titanium nitride) and they comprise, for example, a compound of a metal such as W (tungsten) or Ti (titanium) with Si (silicon).

The upper electrodes 17, 27, 37, and 47 comprise the material identical with that of the lower electrodes 15, 25, 35, and 45, and the phase-change material layers 16, 26, 36, and 46 comprise a phase-change material such as $Ge_2Sb_2Te_5$ (GST). The phase-change memory is a resistance change type non-volatile memory that stores information utilizing that the phase-change material layers 16, 26, 36 and 46 have resistance values which are different between the amorphous state and the crystalline state.

The metal films 19, 29, and 39 are conductive films comprised of, for example, TiN (titanium nitride), which are layers arranged with an aim of preventing the devices below the respective metal films from being heated by laser annealing in the manufacturing step of the semiconductor device in this embodiment, which are not electrically connected with other interconnects such as the word lines 11, 21, 31, and 41, the bit lines 18, 28, 38, and 48, and the contact plugs CP1a to CP4a or CP1b to CP4b, or other devices but are covered with insulating films.

That is, as shown in FIG. 6, in the phase-change memory of this embodiment, memory matrices each including multiple phase-change material layers and multiple diodes as selection devices for each of the memory cells are stacked in plurality and a metal film is formed between each of the memory matrices in respective layers. Plural layers of the memory matrices shown in FIG. 6 are collectively referred to as a memory array. In FIG. 6, only the portion of the stacked memory matrices and the interlayer insulating films and the metal films interposed between each of the memory matrices is shown for easy understanding of the drawings.

Then, the operation of the semiconductor device of this embodiment is to be described with reference to FIG. 7. The phase-change memory stores and holds information by changing a storage device into a crystalline state or an amorphous state by the Joule heat generated in the storage device by applying an electric current from a selection device. Switching of the phase-change memory, that is, phase-changing of the phase-change material from the amorphous state to the crystalline state and the change in the opposed direction utilizes the Joule heat generated upon application of a pulse voltage to the phase-change material layer. That is, upon phase-changing from the amorphous state to a crystalline state at low resistance (set operation, write operation), a voltage for heating the phase-change material to a crystallization temperature or higher and a melting point or lower is applied for a relatively long time. On the other hand, upon phase-changing from the crystalline state to the amorphous state at a high resistance (reset operation, erasing operation), a short pulse voltage to heat the phase-change material to a melting point or higher is applied and then the current is decreased rapidly to quench the phase-change material. Generally, the resistance value of the storage device of the phase-change memory changes as much as from 2-digits to 3-digits due to the phase-change, and the phase-change memory has a feature that the sense operation is easy since the reading signal is different greatly depending on whether the state is crystalline or amorphous.

Figure 7:
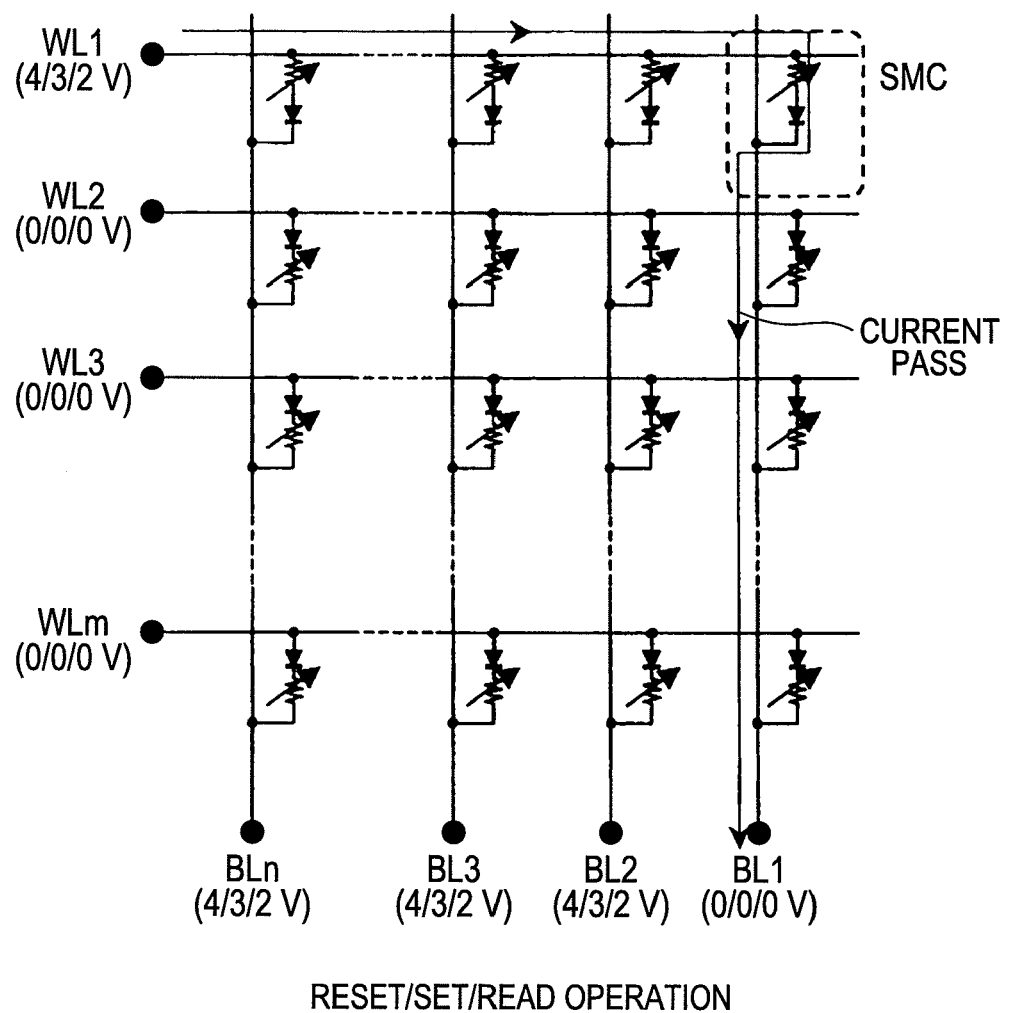
FIG. 7 is an equivalent circuit diagram for explaining the operation of the phase-change memory as the first embodiment of the invention.

FIG. 7 is an equivalent circuit diagram of a phase-change memory of this embodiment. FIG. 7 shows a potential relation between bit lines BL1, BL2, BL3, and BLn and the word lines WL1, WL2, WL3, and WLm upon reset (erasing) operation, set (write) operation, and read operation. The potentials 4/3/2 V on WL1 are potentials upon reset operation, set operation, and read operation, respectively. The bit lines BL1, BL2, BL3, and BLn, for example, show the bit lines 18 shown in FIG. 4 respectively and the word lines WL1, WL2, WL3 and WLm, for example, show the word lines 11 shown in FIG. 2 respectively.

As shown in FIG. 7, in the memory cells connected with the bit lines BL2, BL3 or BLn and connected with the word line WL1, the potentials on the bit lines and the word line are both at 4 V in the reset operation, both at 3 V at set operation, and both at 2 V in the read operation, and current does not flow since there is no potential difference between them. Further, in the memory cells connected to the bit line BL1, and the word line WL2, WL3 or WLm, the potentials on the bit line and the word line are both at 0 V in the reset operation, in the set operation, and in the read operation and current does not flow since there is no potential difference between them.

In the memory cells connected with the bit line BL2, BL3, or BLn and the word line WL2, WL3, or WLm, potentials are applied at 0 V on the word line and at 4 V on the bit line in the reset operation; at 0 V on the word line and at 3 V on the bit line in the set operation; at 0 V on the word line and at 2 V on the bit line in the read operation respectively. That is, a voltage is applied in a reverse bias direction with respect to the polysilicon diode that selects the memory cell. The memory cells connected with the bit line BL2, BL3 or BLn and the word line WL2, WL3 or WLm are non-selected cells, and no current flows since the voltage is applied in the reverse bias direction to the polysilicon diode as the selection device.

Thus, a forward bias is applied to the polysilicon diode and current flows only for the memory cell: connected to the bit line BL1 and the word line WL1 (selected cell SMC). As a result, only the selected cell SMC in the memory cell array can be selected and operated.

Figure 13:
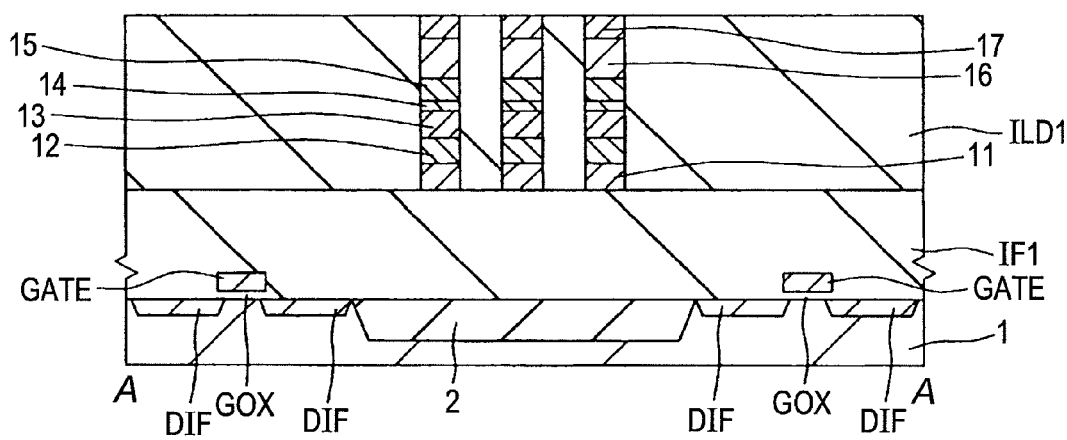
FIG. 13 is a cross sectional view for a main portion explaining the method for manufacturing the semiconductor device succeeding to FIG. 12.
Figure 14:
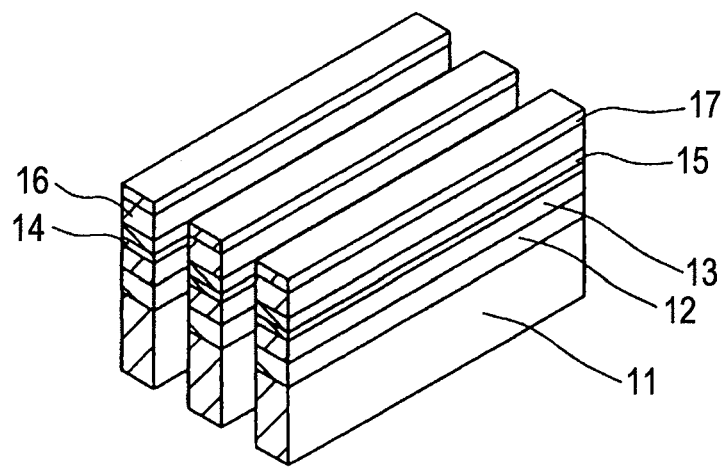
FIG. 14 is a cross sectional view for a main portion explaining the method for manufacturing the semiconductor device succeeding to FIG. 13.
Figure 15:
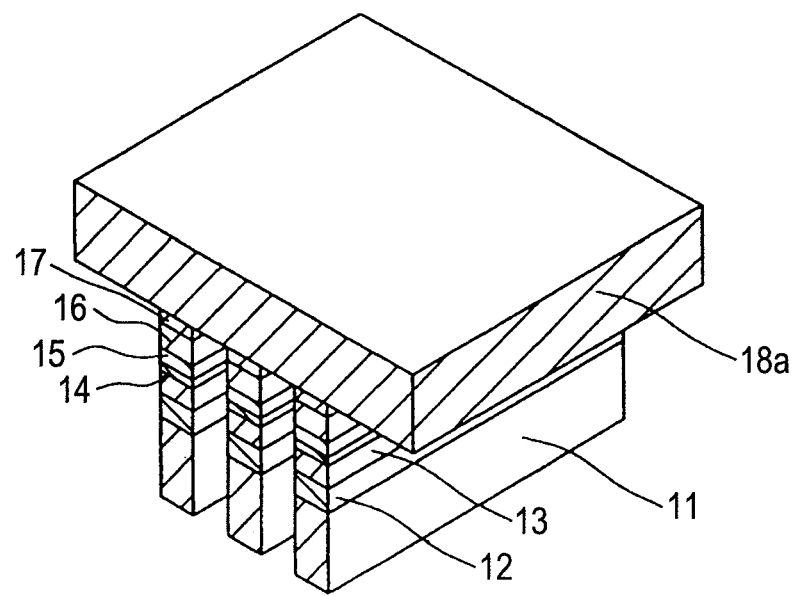
FIG. 15 is a cross sectional view for a main portion explaining the method for manufacturing the semiconductor device succeeding to FIG. 14.
Figure 16:
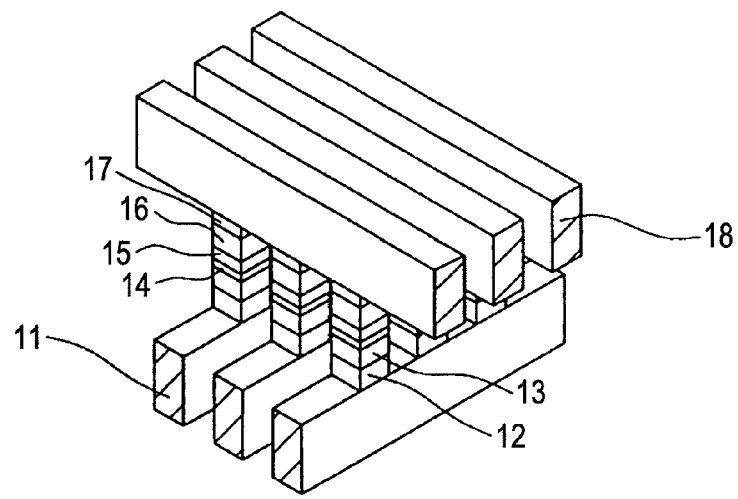
FIG. 16 is a cross sectional view for a main portion explaining the method for manufacturing the semiconductor device succeeding to FIG. 15.

Then, a process for manufacturing a semiconductor device of this embodiment is to be described with reference to FIG. 8 to FIG. 19. FIG. 8 to FIG. 12 and FIG. 17 to FIG. 19 show cross sectional views at a position identical with the cross section along line C-C in FIG. 1, and FIG. 13 shows a cross sectional view at a position identical with the cross section along line A-A in FIG. 1. Further, FIG. 14 to FIG. 16 show perspective views of a memory matrix during the manufacturing process.

Figure 8:
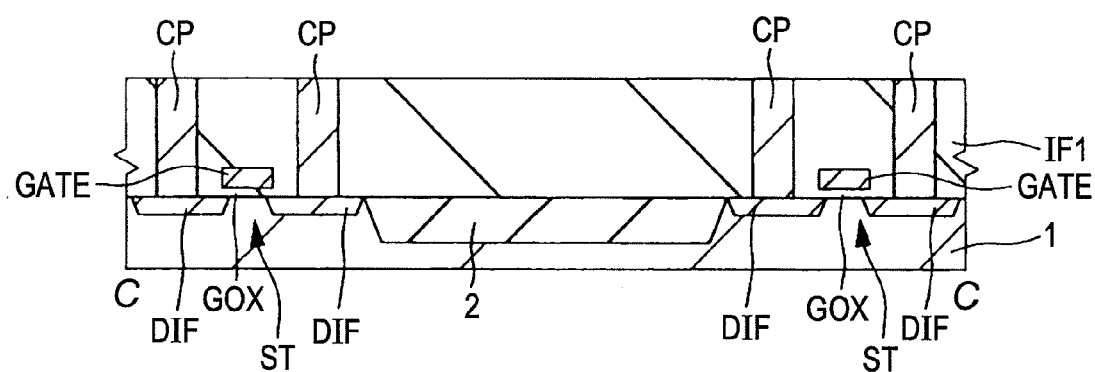
FIG. 8 is a cross sectional view for a main portion showing a method for manufacturing the phase-change memory as the first embodiment of the invention.

At first, as shown in FIG. 8, after forming a device isolation layer 2 in the main surface of a semiconductor substrate 1 by a well-known manufacturing method, a field effect transistor ST having a gate insulating film GOX, a gate electrode GATE, and diffusion layers DIF is formed. The field effect transistor ST is a device that configures a peripheral circuit necessary for driving a memory array, which is a selection transistor for selecting a memory cell of the phase-change memory. Subsequently, an interlayer insulation film IF1 comprised of a silicon oxide is formed over the semiconductor substrate 1 so as to cover the field effect transistor ST, an interlayer insulating film IF1 comprised of a silicon oxide is formed over the semiconductor substrate 1 so as to cover the field effect transistor ST and contact plugs CP passing through the interlayer insulating film FI1 and electrically connected with the diffusion layers DIF are formed over the diffusion layers DIF layers to be electrically connected with each of the bit lines. The interlayer insulating film IF1 is formed (deposited), for example, by a CVD (Chemical Vapor Deposition) method. Successively, the upper surface of the contact plug CP is polished by using a CMP (Chemical Mechanical Polishing) method to expose the upper surface of the interlayer insulating film CP1.

Figure 9:
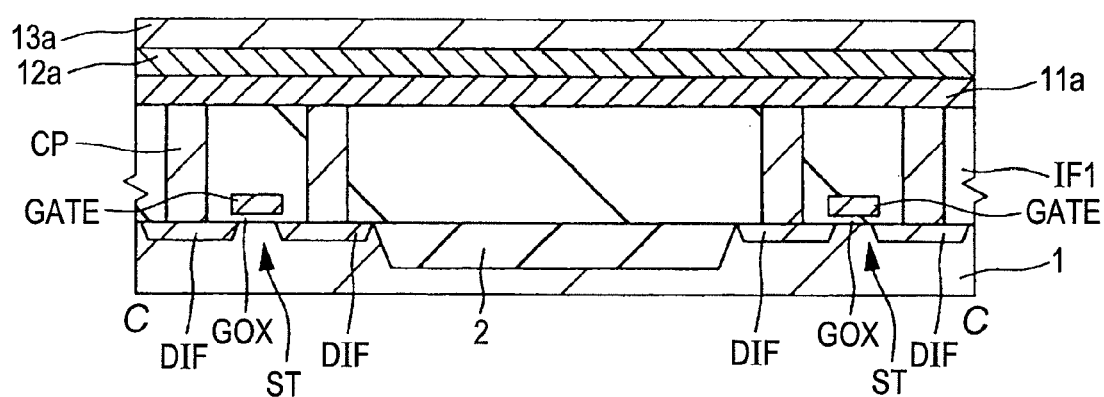
FIG. 9 is a cross sectional view for a main portion explaining a method for manufacturing a semiconductor device succeeding to FIG. 8.

Then, as shown in FIG. 9, a tungsten film 11a, a p-type amorphous silicon film 12a, and a non-doped amorphous silicon film 13a are formed successively above the interlayer insulating film IF1 and the contact plugs CP. The tungsten film 11a is formed by a sputtering method and the film forming temperature is set to 200° C. or lower. The p-type amorphous silicon film 12a and the non-doped amorphous silicon film 13a are deposited by a CVD method, and the film forming temperature of the p-type amorphous silicon film 12a is set to about 400° C., and the film forming temperature of the non-doped amorphous silicon film 13a is set to about 530° C. The p-type amorphous silicon film 12a is a silicon film in an amorphous state with introduction of p-type impurity (for example, B (boron)), and the non-doped amorphous silicon film 13a is a silicon film in an amorphous state with no introduction of the impurity.

Figure 10:
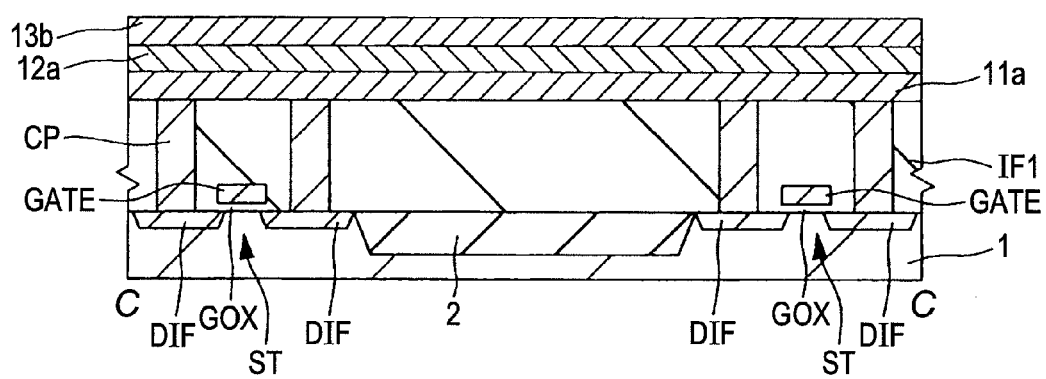
FIG. 10 is a cross sectional view for a main portion explaining the method for manufacturing the semiconductor device succeeding to FIG. 9.

Then, as shown in FIG. 10, an n-type impurity (for example, (P (phosphorus)) is ion implanted into the non-doped amorphous silicon film 13a to form an n-type amorphous silicon film 13b.

Figure 11:
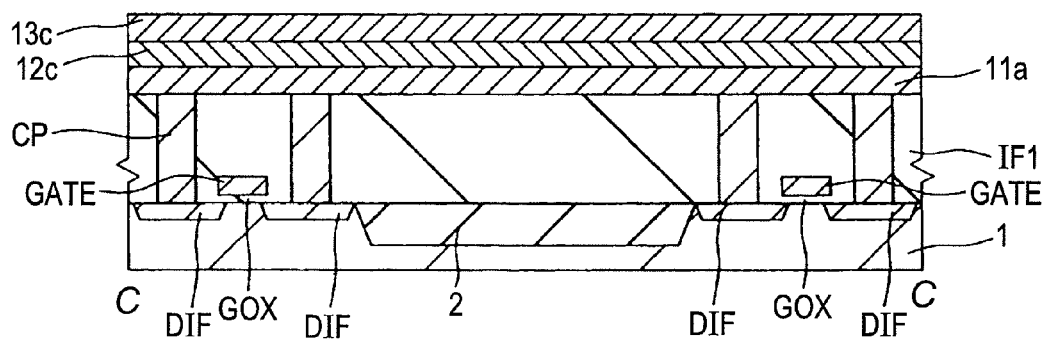
FIG. 11 is a cross sectional view for a main portion explaining the method for manufacturing the semiconductor device succeeding to FIG. 10.

Then, as shown in FIG. 11, the p-type amorphous silicon film 12a and the n-type amorphous silicon film 13b are crystallized and impurity are also activated using by annealing, for example, a $CO_2$ laser. Thus, a p-type polysilicon film 12c and an n-type polysilicon film 13c are formed. At this step, since the phase-change material is not present in the semiconductor device during the manufacturing process, it is not necessary to perform the laser annealing with a purpose of decreasing thermal load and the polysilicon can be crystallized and the impurity can be activated by a heating furnace using lamps or the like. However, in the manufacture of the memory matrix at and after the second layer, the laser annealing is essential as will be described later. In this embodiment, for making the characteristic of the selection device at the first layer and at and after the second layer uniform, laser annealing identical with that used at and after the second layer is used in the annealing step of crystallizing the p-type amorphous silicon film 12a and the n-type amorphous silicon film 13b shown in FIG. 10 into the p-type polysilicon film 12c and the n-type polysilicon film 13c shown in FIG. 11.

Figure 12:
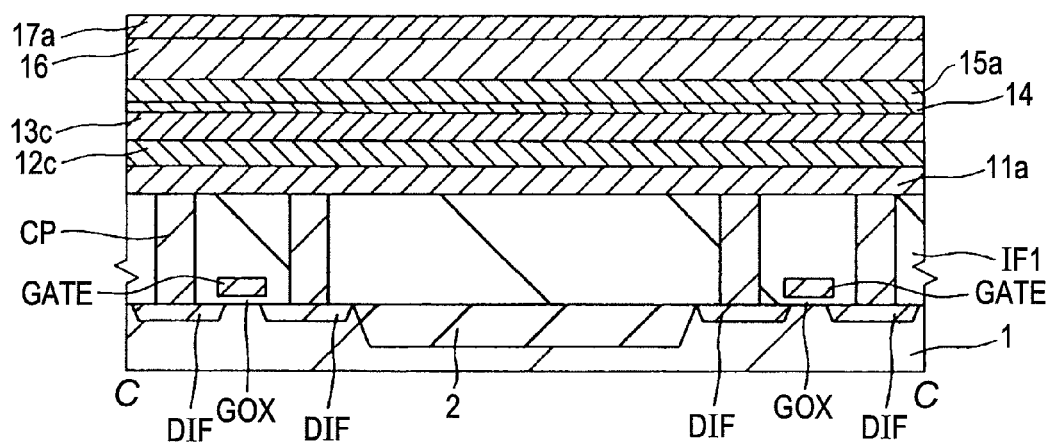
FIG. 12 is a cross sectional view for a main portion explaining the method for manufacturing the semiconductor device succeeding to FIG. 11.

Then, as shown in FIG. 12, after forming a silicide layer 14 comprised of, for example, WSi (tungsten silicide) or $TiSi_2$ over the n-type polysilicon film 13c by a well-known salicide process, a metal film 15a, a phase-change material layer 16, and a metal film 17a are formed successively over the silicide layer 14. The metal film 15a and the metal film 17a comprise Ti (titanium) or W (tungsten) and are formed, for example, by a sputtering method. The phase-change material layer 16 comprises $Ge_2Sb_2Te_5$ (GST) and is formed, for example, by a CVD method.

Then, as shown in FIG. 13, the metal film 17a, the phase-change material layer 16, the metal film 15a, the silicide layer 14, the n-type polysilicon film 13c, the p-type polysilicon film 12c, and the tungsten film 11a are fabricated into a stripe shape extending in the first direction by using photolithography and dry etching. Thus, an upper electrode 17, a lower electrode 15, and an n-type layer 13, a p-type layer 12, and a word line 11 comprised of the metal film 17a, the metal film 15a, the n-type polysilicon film 13c, the p-type polysilicon film 12c, and the tungsten film 11a are formed respectively. In this step, an interconnect layer M1b comprised of a tungsten film 11a (not illustrated) is formed in a layer identical with the word line 11 over the contact plug CP (not illustrated). Successively, an interlayer insulating film ILD1 is deposited above the entire surface of the semiconductor substrate 1 by a CVD method and, after filling a portion, between the fabricated stripe-shape pattern with the interlayer insulating film ILD1, the upper surface of the interlayer insulating film ILD1 is polished by a CMP method to expose the upper surface of the upper electrode 17.

Further, as shown in FIG. 13, contact plugs are not yet formed over the diffusion layer DIF to be electrically connected with each of the bit lines in the subsequent step.

FIG. 14 shows a perspective view of a memory matrix at the first layer formed in the step shown in FIG. 13. FIG. 14 to FIG. 15 are perspective views showing a semiconductor device during the manufacturing process. In FIG. 14, the interlayer insulating film in the layer identical with the memory matrix at first layer, a semiconductor substrate therebelow, etc. are not illustrated. As shown in FIG. 14, multiple patterns including the word line 11, the p-type layer 12, the n-type layer 13, the silicide layer 14, the lower electrode 15, the phase-change material layer 16, and the upper electrode 17 are formed in a stripe shape.

Then, as shown in FIG. 15, after forming the contact plug CP1a (not illustrated) over the diffusion layer DIF (not illustrated), and exposing the upper surface of the upper electrode 17 successively by the CMP method, a tungsten film 18a is formed over the upper electrode 17, over the interlayer insulating film ILD1 (not illustrated), and over the contact plug CP1a (not illustrated) by a sputtering method.

Then, as shown in FIG. 16, the tungsten film 18a, the upper electrode 17, the phase-change material layer 16, the lower electrode 15, the silicide layer 14, the n-type layer 13, and the p-type layer 12 are fabricated into a stripe shape in the second direction to form bit lines 18, and a interconnect layer Mia (not illustrated) comprised of a tungsten film 18a are formed. The bit lines 18 and the interconnect layer M1a (not illustrated) are electrically connected by way of the contact plug CP1a (not illustrated) to the diffusion layer DIF (not illustrated).

Then, an interlayer insulating film IF1a (not illustrated) is deposited over the entire surface of the semiconductor substrate 1 by a CVD method and a space in the stripe shape fabrication pattern including the bit lines 18 is filled with an interlayer insulating film IF1a.

Figure 17:
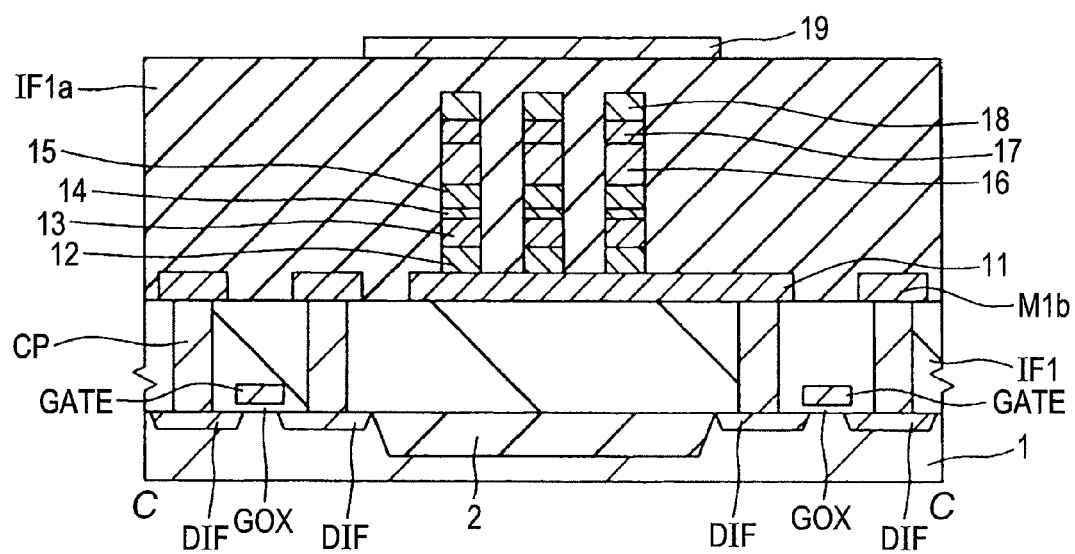
FIG. 17 is a cross sectional view for a main portion explaining the method for manufacturing the semiconductor device succeeding to FIG. 16.

Then, as shown in FIG. 17, after forming a metal film 19 comprised of, for example, TiN over the interlayer insulating film IF1a by a sputtering method, it is patterned by using a photolithography technique and dry etching. In this case, the metal film 19 is formed in a region overlapping the memory matrix including the phase-change material layer 16 below the metal film 19 in view of a plane.

Figure 18:
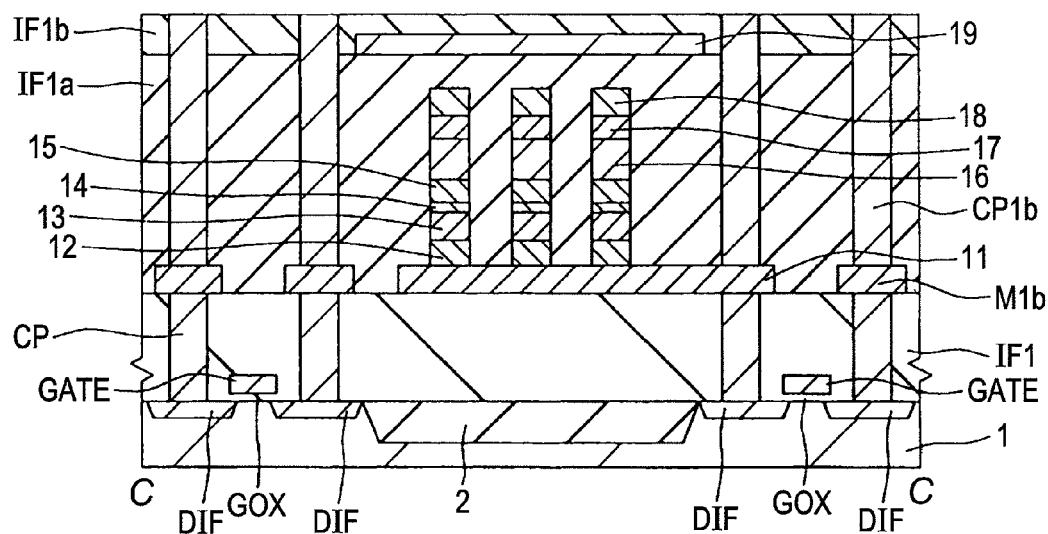
FIG. 18 is a cross sectional view for a main portion explaining the method for manufacturing the semiconductor device succeeding to FIG. 17.

Then, as shown in FIG. 18, an interlayer insulating film IF1b is deposited over the interlayer insulating film IF1a by a CVD method, to cover the surface of the metal film 19 with the interlayer insulating film IF1b. Successively, after forming contact plugs CP1b passing through the interlayer insulating films IF1b and IF1a and electrically connected with the word lines 11 and the interconnect layer M1b, the upper surface of the interlayer insulating film IF1b is polished and planarized by a CMP method. In the polishing step, the upper surface of the metal film 19 is not exposed.

While the metal film 19 is patterned by photolithography and dry etching, the metal film 19 may be also formed in a region overlapping the memory matrix at the lower layer in view of a plane by using a well-known damascene method.

By repeating the steps of FIG. 9 to FIG. 18 in the subsequent process, a stacked structure comprised of plural layers of memory matrices shown in FIG. 1 to FIG. 6 can be formed.

Figure 19:
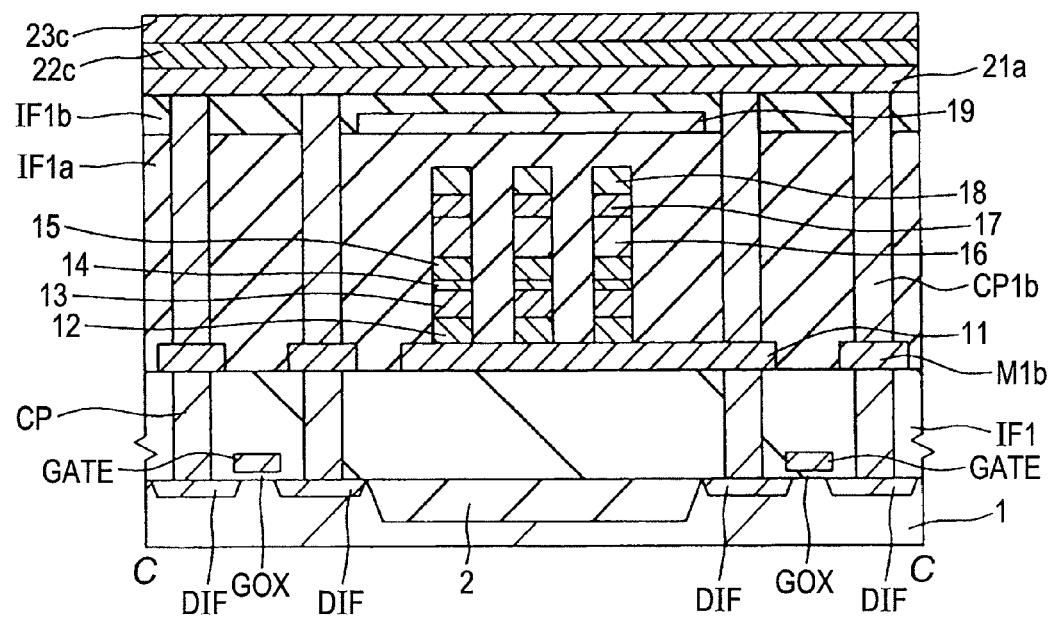
FIG. 19 is a cross sectional view for a main portion explaining the method for manufacturing the semiconductor device succeeding to FIG. 18.

However, as shown in FIG. 19, when the p-type polysilicon film 22c and the n-type polysilicon film 23c that configures the memory matrix at the second layer are formed by crystallizing the p-type amorphous silicon film and the n-type amorphous silicon film in the amorphous state to form the p-type polysilicon film 22c and the n-type polysilicon film 23c in the same manner as the step described with reference to FIG. 11, it is necessary to perform the heat treatment not by using a heating furnace using lamps or the like but by laser annealing. Further, since the use of a laser at a wavelength of 3 μm or more is preferred as will be described later, not a laser at a short wavelength such as a YAG laser or an excimer laser but, for example, a $CO_2$ laser is used. For the laser annealing in this step, it is necessary to provide a sufficient current driving performance of the diode as the selection device by crystallizing the amorphous silicon and activating the impurity and reduce the thermal load on the phase-change material layer 16 that configures the memory matrix at the first layer, thereby not decreasing the yield. In the same manner, the laser annealing is used when crystallizing polysilicon diodes that configures the memory matrices at the third and further upper layers respectively.

After forming plural layers of matrices, it is not necessary to form a metal film similar to the metal film 19 shown in FIG. 18 over the memory matrix at the uppermost layer. Accordingly, a semiconductor device of this embodiment shown in FIG. 2 is completed by forming global bit lines (not illustrated), and global word lines (not illustrated) electrically connected with the diffusion layers DIF over the interlayer insulating film on the bit lines at the uppermost layer (bit line 48 shown in FIG. 2).

Then, the effect of this embodiment is to be described with reference to FIG. 2 and FIG. 20 to FIG. 22.

The semiconductor device of this embodiment uses the phase-change memory using the phase-change material as a storage device. The phase-change memory is excellent as the storage device with the view point of number of cycles of rewriting, holding characteristic, operation speed, etc. However, the phase-change material involves a problem that the melting point is low and the characteristic is degraded due to a sublimation of a portion of elements when exposed at a high temperature higher than the melting point for a long time. On the other hand, a transistor or a diode using a semiconductor material such as polysilicon cannot provide sufficient performance unless crystallization of the material and activation of impurity are performed by annealing at a high temperature. That is, in the manufacturing process of a cross-point-type memory array having a stacked structure using a phase-change material and a diode, it is necessary to obtain a compatibility between the improvement of the performance due to annealing for crystallization of the diode material and the activation of the impurity in the upper layer, and prevention of the degradation of the characteristic of the phase-change material layer at the lower layer due to thermal load in the step.

When a semiconductor device in which a metal film other than the word line and the bit line is not formed and only the interlayer insulating film comprised of, for example, silicon oxide is formed between a memory matrix at the upper layer and a memory matrix at the lower layer, the phase-change material layer is the memory matrix at the layer below the amorphous silicon film is also heated by the laser when the amorphous silicon film that configures the diode in the memory matrix at the upper layer is crystallized. Since the phase-change material layer in the laser below is melted or sublimed, it may be a possibility that it does not function as the phase-change memory.

For solving the problem, in this embodiment, a metal film 19 insulated from each of the memory matrices, each of the word lines, each of the bit lines, and each of the contact plugs is disposed in the interlayer insulating film between the memory matrix at the first layer containing the phase-change material layer 16 and the memory matrix at the second layer containing the polysilicon diode crystallized by the laser annealing as shown in FIG. 2. In the same manner, the metal film 29 is formed between the memory matrix at the second layer and the memory matrix at the third layer, and the metal film 39 is formed between the memory matrix at the third and the memory matrix at the fourth layer.

When the amorphous silicon film is crystallized in the process of manufacturing the semiconductor device, the laser annealing is used instead of the lamp annealing in order to prevent the already formed device from undergoing thermal loads. Particularly, for the crystallization and the activation of the memory cell at the upper layer, the thermal load is decreased not by the heat treatment at the order of seconds by the lamp annealing technique using tungsten halogen lamps but by a high temperature heat treatment in an extremely short time (for example, at 1200° C. for 800 μm) by the laser annealing at a long wavelength of 3 μm or more (for example, $CO_2$ laser at a wavelength of 10.64 μm). Annealing at 1,000° C. or higher is necessary for crystallizing the amorphous silicon film and activating the impurity in the amorphous silicon film.

Figure 20:
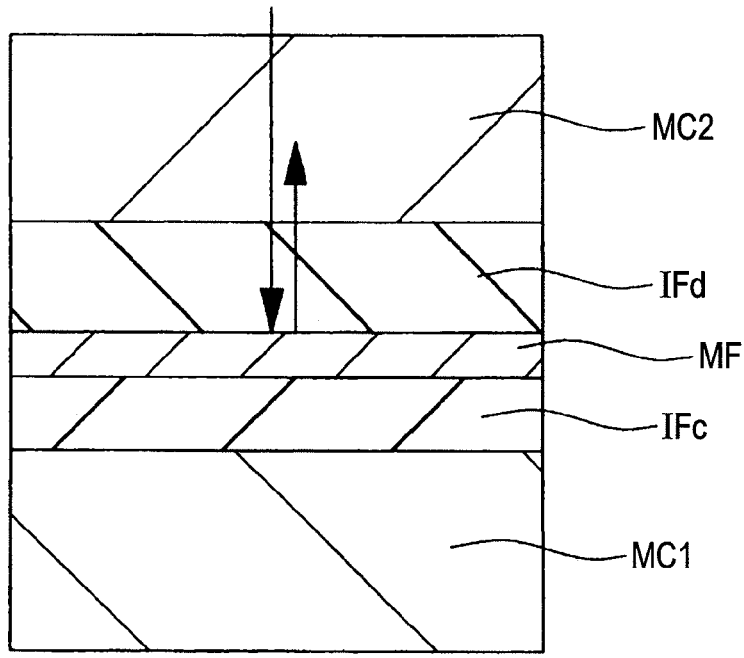
FIG. 20 is a cross sectional view for a main portion of a semiconductor device shown as an example 19.

Then, the principle of the invention is to be described with reference to FIG. 20. FIG. 20 is a cross sectional view for a main portion of a semiconductor device shown as an example and shows a memory cell MC1 at a lower layer, an interlayer insulating film IFc, a metal film MF, an interlayer insulating film IFd, and a memory cell MC2 at an upper layer deposited successively in this order over the memory cell MC1 at the lower layer. A polysilicon film that configures the memory cell MC2 at the upper layer (film corresponding to the p-type layer 12 and the n-type layer 13, etc. shown in FIG. 2) is formed by crystallizing an amorphous silicon film that can be formed at a lower temperature than the polysilicon film by a heat treatment with a laser shown by arrows in FIG. 20 in order to prevent the degradation of the characteristic of the phase-change material layer in the memory cell MC1 at the lower layer formed below the memory cell MC2 at the upper layer.

That is, when the polysilicon film that configures the memory cell MC2 at the upper layer is formed in a polycrystal state (state of polysilicon) from the initial state, the entire semiconductor substrate has a heat at a temperature of about 640° C. However, the phase-change material (GST) in the memory cell MC1 at the lower layer may possibly be melted or sublime at a temperature higher than 600° C. and lose the function as the phase-change memory. That is, since the heat resistant temperature of the phase-change material is 600° C., it is necessary that the temperature of the phase-change material layer is 600° C. or lower during the manufacturing process of the semiconductor device. Accordingly, when the polysilicon film that configures the memory cell MC2 at the upper layer is formed, an amorphous silicon film that can be formed at about 520° C. is formed at first and then a polysilicon film comprised of the amorphous silicon film is formed by the laser annealing.

For a semiconductor device substantially identical with that shown in FIG. 20 but having no metal film formed between the memory cell at the lower layer and the memory cell at the upper layer, when the memory cell at the upper layer is heated by a laser, the laser transmits through the interlayer insulating film below the memory cell at the upper layer and directly heats the memory cell at the lower layer. When the laser is radiated to the phase-change material layer in the memory cell at the lower layer, the memory cell at the lower layer is heated by laser heating and the heat transmitting from the heated memory cell at the upper layer and the interlayer insulating film. Even when the interlayer insulating film is formed over the memory cell at the lower layer, the laser transmits the interlayer insulating film and directly heats the memory cell at the lower layer.

Therefore, it is at first necessary that the laser does not reach as far as the memory cell MC1 at the lower layer shown in FIG. 20. A laser at a wavelength of 3 μm or more shows a reflectance of about 100% to the metal film MF and it is possible to prevent the memory cell MC1 at the lower layer from being heated directly by the laser that transmits the metal film MF and irradiated the memory cell MC1 at the lower layer. When an excimer laser or a YAG laser at a wavelength shorter than 3 μm is used, since the reflectance of the laser at the metal film MF is lowered, the metal film MF is directly heated by the laser to a high temperature (for example, 900° C.) and the heat is transmitted to the memory cell MC1 at the lower layer.

Secondly, it is necessary that the polysilicon film that configures the memory cell MC2 at the upper layer comprises a metal not absorbing heat excessively when the amorphous silicon film is crystallized by a heat treatment. This is important also for preventing the degradation of the characteristic of the phase-change material layer in the memory cell MC1 at the lower layer, as well as for promoting the crystallization of the polysilicon film in the memory cell MC2 at the upper layer. Since the laser annealing is a heat treatment conducted for an extremely short time, a heat treatment at a temperature higher than that for the crystallization of silicon by a well known furnace annealing or lamp annealing is necessary. When the heat absorption of the metal film MF is excessively high, there may be a possibility that a heat necessary for crystallizing the amorphous silicon film in the memory cell MC2 at the upper layer to form a polysilicon film cannot be obtained. Further, when the metal film NF absorbs heat excessively, since the metal film MF is heated to a high temperature by so much, the heat calorie transmitted from the metal film MF to the memory cell MC1 at the lower layer is also increased and the memory cell MC1 at the lower layer is heated excessively. Accordingly, the metal film MF is preferably formed of a material that absorbs heat to such an extent that the temperature of the phase-change material layer in the memory cell MC1 at the lower layer does not reach the melting point and reflects the laser substantially by 100%.

It is generally known that a material having a high electroconductivity (low resistance value) shows a high heat absorption, whereas a material having a low electroconductivity (high resistance value) has a low heat absorption. In this embodiment, the material for the metal films 19, 29, and 39 shown in FIG. 2 is formed of TiN (titanium nitride) to form metal films of higher resistance than other contact plugs and interconnects thereby increasing the heat absorption and preventing the phase-change material layers at the layers below the respective metal films from undergoing thermal damages. For example, the metal films 19, 29, and 39 have higher resistance value than the contact plug CP1a and the bit line 18 and lower thermal conductivity than the contact plug CP1a or the bit line 18. That is, the metal films 19, 29, and 39 are metal films having lower heat absorption than the contact plug CP1a and the bit line 18.

In usual LSI technology, materials such as W (tungsten), Al (aluminum), or TiN (titanium nitride) used in the step of forming an interconnect and the step for forming a contact plug for connecting an interconnect and a transistor is formed so as to have low resistance, that is, high electroconductivity by adjusting the manufacturing conditions in a manufacturing step using a sputtering method or a CVD method thereby improving the characteristic and the operation speed of a device. On the other hand, the present invention has a feature of conversely increasing the resistance value of the metal film MF shown in FIG. 20. Since the thermal conductivity of the metal film MF is lowered by increasing the resistance of the metal film MF, this can prevent the metal film MF from excessively absorbing the heat of the memory cell MC2 at the upper layer so that the heat is conducted from the metal film MF at a high temperature to the phase-change material layer in the memory cell MC1 at the lower layer upon heat treatment in the step of forming the polysilicon film in the memory cell MC2 at the upper layer.

For crystallizing the polysilicon film that configures the memory cell MC2 at the upper layer, a method of using a laser such as an excimer laser or a YAG laser may also be considered. However, all of silicon that configures the memory cell MC2 at the upper layer is melted and recrystallized when heated by the laser described above. Therefore, the heat absorption amount of the metal film MF is increased excessively to decrease one of the effects of the invention of preventing the degradation of the characteristic of the phase-change material layer in the memory cell MC1 at the lower layer. Further, when the polysilicon film in the memory cell MC2 at the upper layer has a p-type and n-type stacked structure as the p-type layer 22 and the n-type layer 23 shown in FIG. 2, the annealing method by the excimer laser or the YAG laser of recrystallizing silicon after melting involves a problem that the operation of the diode cannot be attained since the p-type and n-type impurities are mixed. Accordingly, when the silicon film in the memory cell MC1 at the upper layer is crystallized by the laser annealing, the $CO_2$ laser not heating the silicon film to an excessively high temperature is used preferably.

Figure 21:
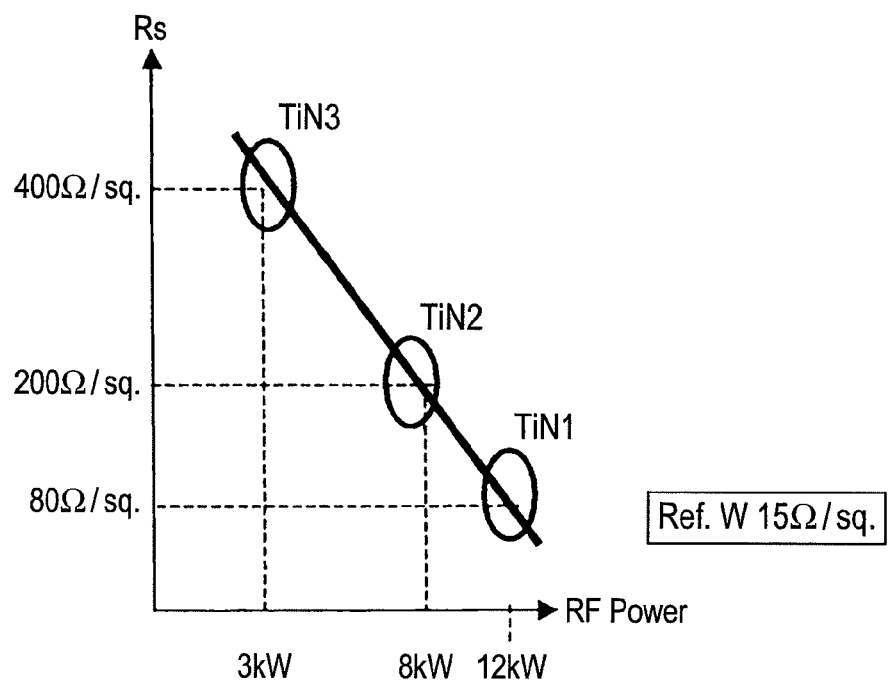
FIG. 21 is a graph representing a relation between an RF power for plasma excitation upon forming a TiN film and a resistance value of the TiN film.

Then, materials of the metal film used as a laser reflection layer and a heat absorption layer in this embodiment are to be described with reference to FIG. 21 and FIG. 22. FIG. 21 is a graph showing the effect of modifying the resistance value by the control of the manufacturing parameters (manufacturing conditions) of a titanium nitride (TiN) film as an example of the material for the metal films 19, 29, and 39 (refer to FIG. 2) in this embodiment. The graph shows that the resistance value of the TiN film can be made higher than the resistance value of the metal film comprised of TiN used in the well-known contact plug by controlling the flow rate of the nitrogen gas and the RF power for plasma excitation as the manufacturing parameters.

Figure 22:
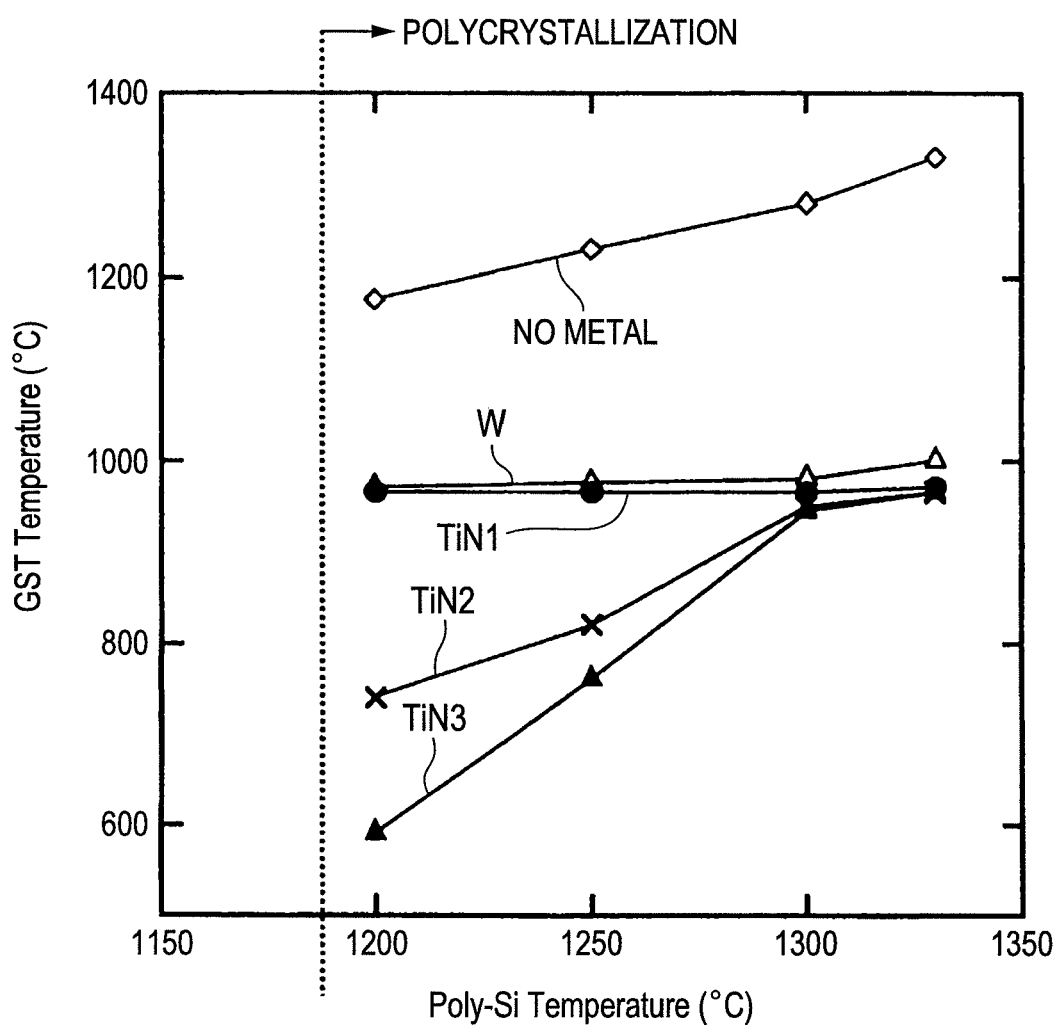
FIG. 22 is a graph representing a relation of temperatures between an upper layer memory cell and a lower layer memory cell in a laser annealing step.

FIG. 22 is a graph showing the result of evaluation for the actual temperature of the memory cell MC1 at the lower layer when the polysilicon film that configures the memory cell MC2 at the upper layer shown in FIG. 20 is crystallized under the condition of an annealing time of 800 μs by using the $CO_2$ laser. The ordinate in the graph of FIG. 22 shows the temperature of the memory cell MC1 at the lower layer, that is, the temperature of the phase-change material layer (GST) in the memory cell MC1 at the lower layer. The abscissa in FIG. 22 shows the temperature of the silicon film in the memory cell MC2 at the upper layer.

Under the annealing condition described above, temperature at 1175° C. or higher is necessary for crystallizing amorphous silicon into polysilicon. When the metal film MF is not present between the memory cell MC2 at upper layer and the memory cell MC1 at the lower layer shown in FIG. 20, the $CO_2$ laser transmits the insulating film between the memory cell MC2 at the upper layer and the memory cell MC1 at the lower layer. Therefore, the memory cell MC1 at the lower layer is heated directly by the $CO_2$ laser and the memory cell MC2 at the upper layer and the memory cell MC1 at the lower layer are substantially at an identical temperature. This can be seen from the graph of "NO METAL" in FIG. 22.

Further, as shown in the graph "W" in FIG. 22, when W (tungsten) is used as the material for the metal film, since the thermal conductivity is excessively high, the temperature of the memory cell MC1 at the lower layer shown in FIG. 20 is increased to about 950° C. This shows that the metal film comprised of tungsten excessively absorbs the heat in the memory cell MC2 at the upper layer.

On the other hand, when TiN (titanium nitride) is used for the metal film, the temperature of the phase-change material layer in the memory cell MC1 at the lower layer can be lowered to 600° C. as shown in the graph for "TiN3" upon annealing the memory cell in the upper layer at a temperature higher than 1000° C. (about 1200° C. in this case) by modifying the resistance values of the TiN film as shown in the graphs "TiN1", "TiN2", "TiN3", respectively as shown in FIG. 22. That is, it can be seen that increase of the temperature of the phase-change material layer to higher than the heat resistant temperature of the phase-change material when the memory cell at the upper layer is annealed at 1200° C. can be prevented by using the TiN film for the metal film.

For further lowering the temperature of the memory cell at the lower layer, the temperature can be adjusted optionally by changing the thickness of the insulating films comprised of a silicon oxide film or the like present above and below the metal film.

In this embodiment, a metal film is formed between the memory matrix at the upper layer and the memory matrix at the lower layer in a memory array formed by stacking multiple memory matrices as shown in FIG. 2. This can prevent the phase-change material layer 16 in the memory matrix at the lower layer from being heated excessively by reflecting the laser at the metal film 19 and appropriately absorbing the heat of the memory matrix at the upper layer by the metal film 19 when the amorphous silicon film that configures the memory matrix at the upper layer is crystallized by the laser as in the step shown in FIG. 19. That is, the yield in the manufacturing process of the semiconductor device is improved by preventing the phase-change material layer in the memory matrix at each of the layers from melting or subliming. Further, the reliability of the semiconductor device can be improved by preventing the phase-change material layer in the memory matrices at each of the layers from melting or subliming.

In the annealing step shown in FIG. 11 and FIG. 18, the heat treatment is performed by the $CO_2$ laser, thereby preventing the amorphous silicon film from melting and the diode from loosing the function.

Further, since the metal films 19, 29, and 30 shown in FIG. 2 are formed of a metal film at high resistance and low thermal conductivity, it is possible to restrict the heat absorption to lower than other metal materials for bit lines, contact plugs, etc. and prevent the heat conduction from each of the layers above respective metal films 19, 20, and 39 to each of the layers below the respective metal films. That is, the metal films 19, 29, and 39 are formed of a material having a thermal conductivity lower than that of the metal material, for example, of the contact plug CP1a, the bit line 18, etc.

In this embodiment, while layers are stacked by the number of four in the memory matrix, but this is not restrictive and the memory array may have a stacked structure so long as it comprises plural layers.

Further, while the material for the metal films 19, 29, and 39 shown in FIG. 2 is formed of TiN, it may be a material containing Al (aluminum) or W (tungsten). In this case, the resistance value of the metal film can be controlled easily and a metal film having an appropriate heat absorption can be formed easily by using not a metal film comprised of, for example, pure Al (aluminum) but using a metal film comprised of a compound or an alloy of Al (aluminum) with other element.

While this embodiment has been described to a case where the interconnect below the diode is a word line, and the interconnect above the phase-change memory is a bit line, the interconnect below the diode may be the bit line and the interconnect above the phase-change memory may be the word line.

Second Embodiment

In the first embodiment, a semiconductor device having a cross-point-type phase-change memory has been described. In this embodiment, a structure of a semiconductor device having a vertical chain memory type phase-change memory is to be described with reference to FIG. 23 to FIG. 40.

Figure 23:
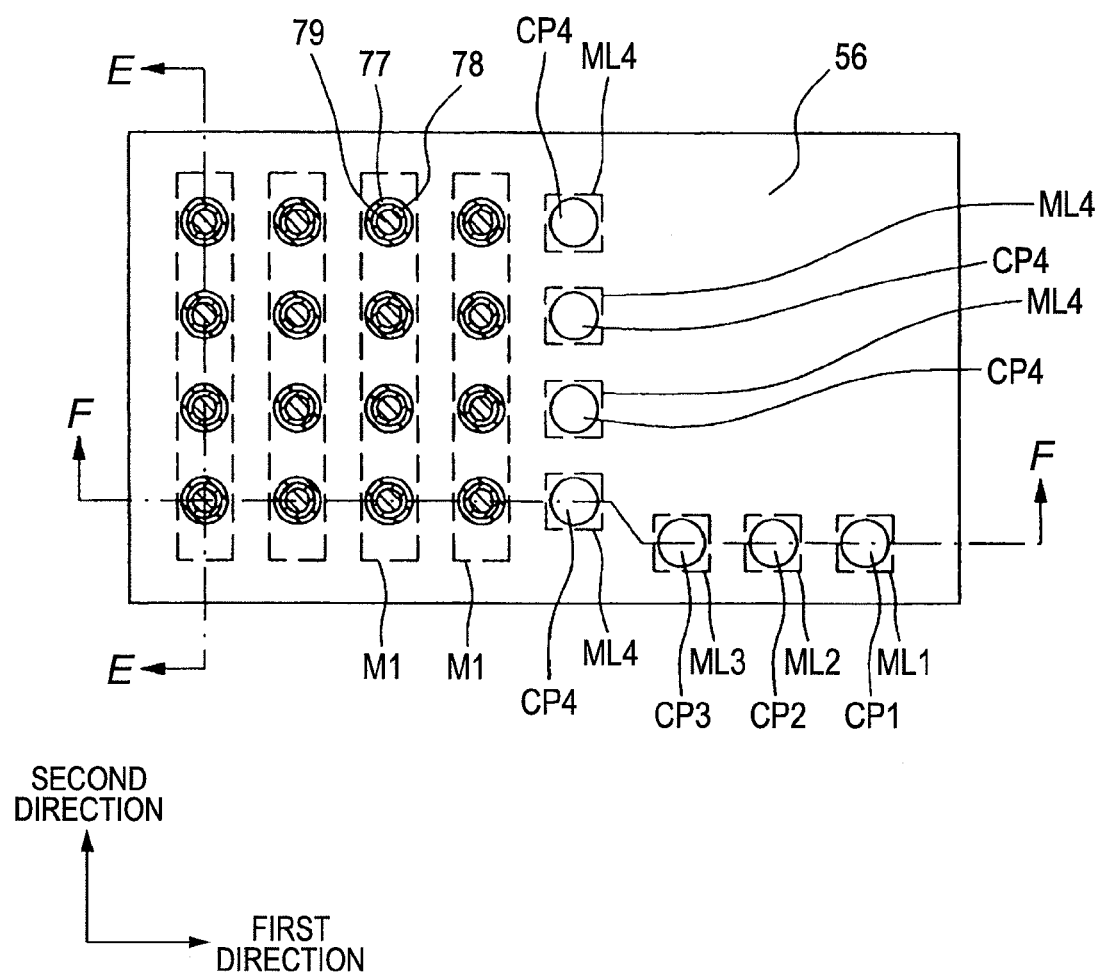
FIG. 23 is a plan view of a phase-change memory as a second embodiment of the invention.
Figure 24:
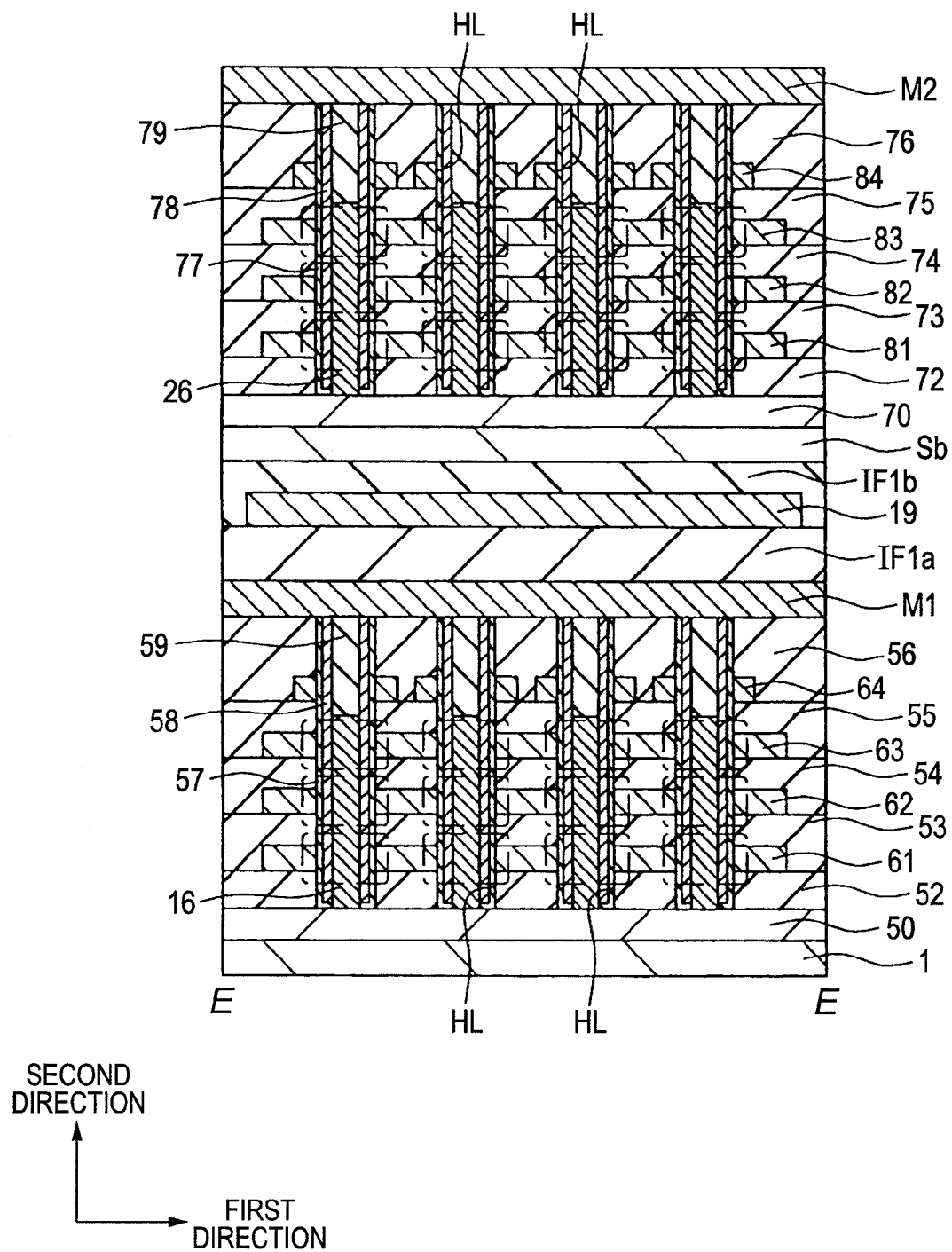
FIG. 24 is a cross sectional view for a main portion along line E-E in FIG. 23.
Figure 25:
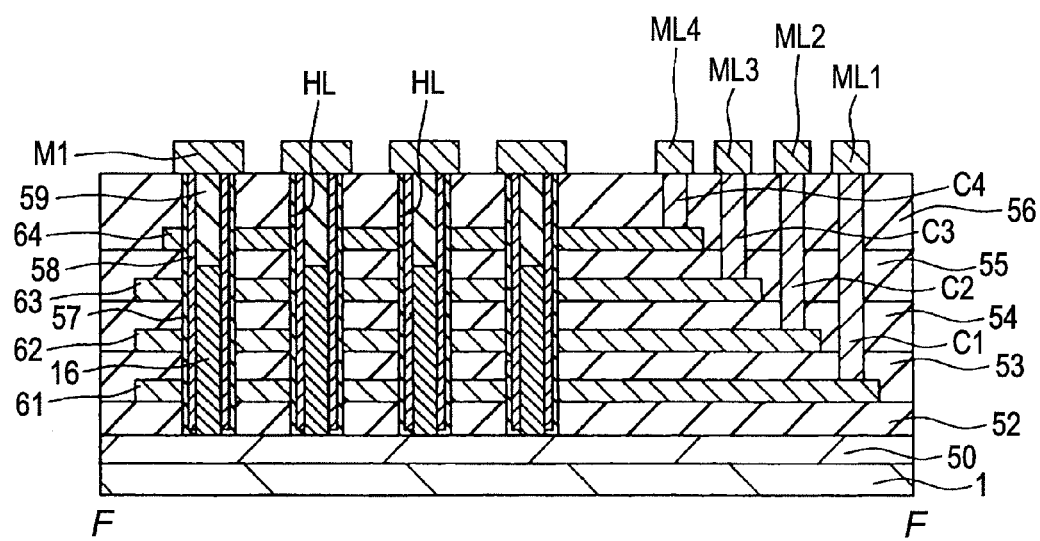
FIG. 25 is a cross sectional view for a main portion along line F-F in FIG. 23.

At first, a structure of a phase-change memory of this embodiment is to be described with reference to FIG. 23 to FIG. 25. FIG. 23 shows a plan view of a phase-change memory, FIG. 24 shows a cross sectional view for a main portion along line E-E in FIG. 23, and FIG. 25 shows a cross sectional view for a main portion along line F-F in FIG. 23. In FIG. 25, however, structures in the layer above a metal interconnect M1 shown in FIG. 24 is not illustrated. FIG. 23 is a plan view showing the upper surface of an insulating film 56 and the structure above the insulating film 56 is shown by a broken line only for the contours of metal interconnects M1 and interconnects ML1 to ML4.

As shown in FIG. 24, a phase-change memory of this embodiment is formed above a semiconductor substrate 1, and an impurity diffusion layer 50 is formed over the semiconductor substrate 1. Above the impurity diffusion layer 50, an insulating film 52, a first polysilicon film 61, an insulating film 53, a second polysilicon film 62, an insulating film 54, a third polysilicon film 63, an insulating film 55, a fourth polysilicon film 64, and an insulating film 56 are formed successively. The fourth polysilicon film 64 has a stripe shape extending in a first direction along the main surface of the semiconductor substrate 1 and formed in a row in plurality in a second direction perpendicular to the first direction along the main surface of the semiconductor substrate 1.

Multiple holes HL passing through the insulating films 52 to 56 and the first polysilicon film 61 to the fourth polysilicon film 64 are formed in the insulating films 52 to 56 and first polysilicon film 61 to the fourth polysilicon film 64. As shown in FIG. 23, the holes HL are arranged in a matrix in plurality in the first direction and the second direction, in which the holes HL arranged in the first direction pass through the identical fourth polysilicon film 64 as shown in FIG. 24 and FIG. 25, and the holes HL arranged in the second direction pass through the different fourth polysilicon films 64, respectively.

As shown in FIG. 24, an insulating film 57, a channel polysilicon film 58, and a phase-change material layer 16 are formed successively from the inner wall side of the hole HL on the inner wall of each hole HL below the metal film 19 and the inside of each hole HL is filled with an insulating film 59 formed over the insulating film 57, the channel polysilicon film 58, and the phase-change material layer 16.

A metal interconnect M1 extending in a stripe shape in the second direction is formed over the insulating film 57, over channel polysilicon film 58, over the insulating film 59, and over the insulating film 56. The channel polysilicon film 58 is electrically connected at an upper portion with the metal interconnect M1 and electrically connected at a lower portion with an impurity diffusion layer 50. The metal interconnect M1 is covered with an interlayer insulating film IF1a formed over the insulating film 56 and a metal film 19 and an interlayer insulating film IF1b are formed successively over the interlayer insulating film IF1a.

As shown in FIG. 25, the first polysilicon film 61 to the third polysilicon film 63 extend respectively in the first direction. The first polysilicon film 61 has a region not overlapping the second polysilicon film 62 and the third polysilicon film 63 in view of a plane, and the second polysilicon film 62 has a region not overlapping the third polysilicon film 63 in view of a plane. The first polysilicon film 61 is electrically connected with an interconnect ML1 formed over the contact plug C1 and the insulating film 56 by way of the contact plug C1 passing through the insulating films 53 to 56. In the same manner, the second polysilicon film 62 is electrically connected with an interconnect ML2 formed over the contact plug C2 and the insulating film 56 by way of the contact plug C2 passing through the insulating films 54 to 56. In the same manner, the third polysilicon film 63 is electrically connected with an interconnect ML3 formed over the contact plug C3 and over the insulating film 56 by way of the contact plug C3 passing through the insulating films 55 and 56. Further, the respective fourth polysilicon films 64 extending in the first direction are electrically connected with multiple interconnects ML4 formed over the contact plug C4 and the insulating film 56 by way of multiple contact plugs C4 passing through the insulating film 56. The respective interconnects ML4 are integrated and insulated from each other.

The semiconductor substrate 1 is a substrate comprised of, for example, silicon, the impurity diffusion layer 50 is a layer as a contact layer of the memory cell on the side of the substrate and comprises a semiconductor layer to which an n-type impurity (for example, P (phosphorus) or As (arsenic)) is introduced at a relatively high concentration. The insulating films 52 to 56, and 59 are layers comprised of, for example, a silicon oxide film, the first polysilicon film 61 to the fourth polysilicon film 64 are polycrystal semiconductor layers to which an n-type impurity (for example, P (phosphorus) or As (arsenic)) is introduced, and the film thickness for each of them is defined as 30 nm or more and 100 nm or less. The first polysilicon film 61 to the fourth polysilicon film 64 have a role as a gate electrode of a selection transistor and a word line. Further, the metal interconnect M1 is an interconnect having a function of the bit line in the phase-change memory.

The channel polysilicon film 58 is a layer that functions as the channel and the source-drain region of each of the selection transistors to which an n-type impurity (for example, P (phosphorus), or As (arsenic)) is introduced. Since the upper portion and the lower portion of the channel polysilicon film 58 function as the source-drain region, the channel polysilicon film 58 in the layer identical with the insulating film 52 and the insulating film 56 has higher impurity concentration than the channel polysilicon film 58 in the layer identical with the insulating films 53 to 55 and the first polysilicon film 61 to the third polysilicon film 63.

Each of the regions surrounded by broken lines shown in FIG. 24 shows a memory cell. That is, each of the phase-change material layers 16 surrounded by the first polysilicon film 61 to the third polysilicon film 63 that configures a memory cell, and multiple memory cells arranged in a matrix are disposed by three layers between the impurity diffusion layer 50 and the metal film 19. Plural memory cells between the impurity diffusion layer 50 and the metal film 19 is referred to as a memory matrix at the first layer.

An identical structure with that from the impurity diffusion layer 50 to the interlayer insulating film IF1a above the semiconductor substrate 1 is formed above the interlayer insulating film IF1b, and a memory matrix at the second layer having the same structure as the memory matrix at the first layer is formed over the impurity diffusion layer 70 formed above the interlayer insulating film IF1b.

In FIG. 23 to FIG. 25, the selection gate and the bit line in each of the layers are electrically connected by way of the interconnect and the contact plug to a peripheral circuit or the like so as to enable write, read and erasure but the interconnects, contact plugs, and peripheral circuits thereof are not illustrated.

Figure 26:
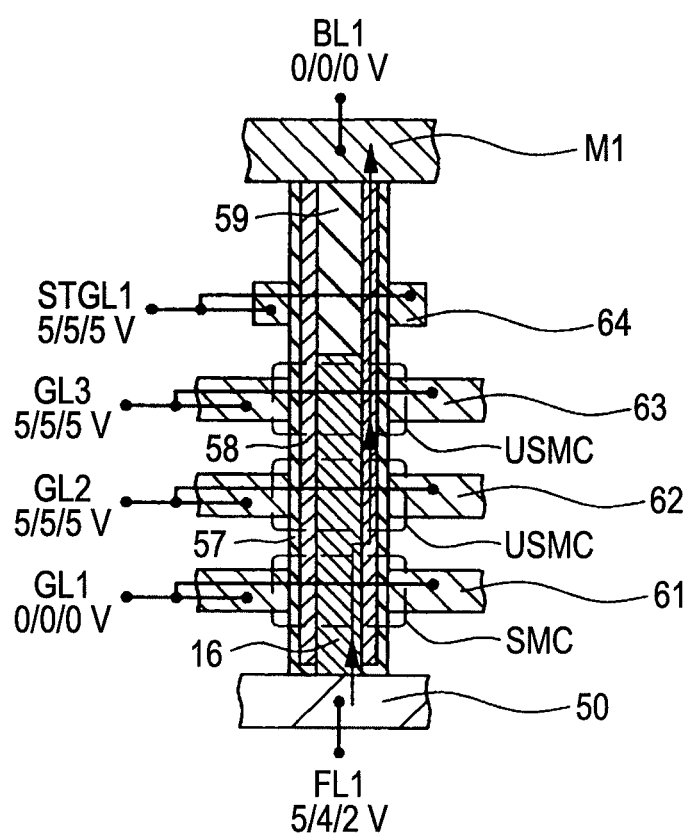
FIG. 26 is a cross sectional view for a main portion showing a portion of a phase-change memory as the second embodiment of the invention.

Then, the operation of the phase-change memory in this embodiment is to be described with reference to FIG. 26 and FIG. 27. FIG. 26 shows only one set of memory cells (vertical chain memory cell) in one hole HL (refer to FIG. 25) and the polysilicon film in adjacent with the set of memory cells in the phase-change memory of this embodiment which are extracted as a cross sectional view for a main portion. In this embodiment, a set of memory cells in one hole HL is referred to as a memory cell block.

Figure 27:
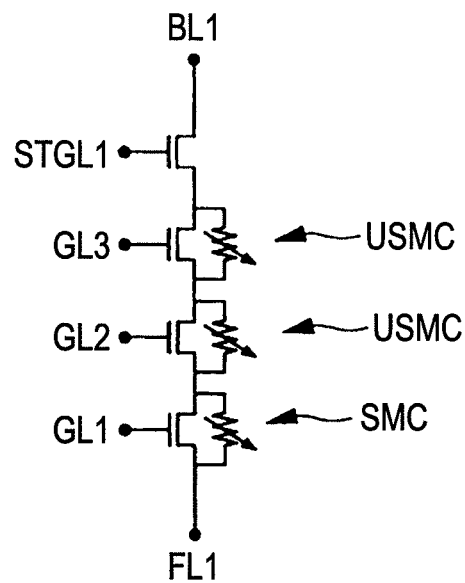
FIG. 27 is an equivalent circuit diagram of a memory cell block as the second embodiment of the invention.

FIG. 27 shows an equivalent circuit diagram of a memory cell block. The memory cell block referred to herein includes a phase-change material layer 16, the channel polysilicon film 58, and the insulating film 57 in the hole HL, and the first polysilicon film 61 to the fourth polysilicon film 64 adjacent with the hole HL formed on the impurity diffusion layer 50 shown in FIG. 24. Three memory cells each comprised of a phase-change material layer 16 in the vicinity of each of the first polysilicon film 61 to the third polysilicon film 63 (cells shown by broken lines in FIG. 24 and FIG. 26, which are a selected cell SMC and not-selected cells USMC in FIG. 26 and FIG. 27) are illustrated.

A method of writing (storing), erasing, or reading information by operating only the selected cell SMC containing the phase-change material layer in a region in the vicinity of the first polysilicon film 61 (refer to FIG. 24) in the memory cell block shown in FIG. 26 and FIG. 27 thereby changing the phase only for the phase-change material layer in the selected sell SMC is to be described.

In FIG. 26, gate interconnects GL1 to GL3 and STGL1 are not shown and only reference numerals are indicated for easy understanding of the sites to be connected with the first polysilicon film 61 to the fourth polysilicon film 64. Voltages applied to the gate interconnects GL1 to GL3 and STGL1 are indicated below each of the reference numerals for the gate interconnects GL1 to GL 3 and STGL1 in each of the reset (erasure) operation/set (write) operation/read operation successively. As shown in FIG. 26, the first polysilicon film 61, the second polysilicon film 62, the third polysilicon film 63, and the fourth polysilicon film 64 are electrically connected with the gate interconnects GL1, GL2, GL3, and STGL1 respectively. Further, the impurity diffusion layer 50 is electrically connected with an interconnect FL1 (only the reference numeral is indicated) and the metal interconnect M1 is an interconnect having a function as a bit line BL1.

The operation of each of the memory cells is performed as described below. At first, 0 V is applied to the gate interconnect GL1 (first polysilicon film 61) connected with the selected cell SMC shown in FIG. 26, to turn OFF the transistor having the channel polysilicon film 58 near the gate interconnect GL1 as a channel. 5 V is applied to the gate interconnects GL2 and GL3 (second polysilicon film 62 and third polysilicon film 63) not connected with the selected cell SMC to turn ON the transistors having each of the gate interconnects GL2 to GL3 as the gate. 0 V is applied to the bit line BL1, and 5 V, 4 V, and 2 V are applied to the interconnect FL1 in the reset operation, set operation, and read operation respectively. 5 V is applied to the gate interconnect STGL1 (fourth polysilicon film 64) to turn ON the transistor.

In the not-selected sell USMC in the vicinity of the second polysilicon 62 and the third polysilicon film 63, the transistor is in the ON state and the resistance of the channel (channel polysilicon film 58) is lowered, and the resistance of the channel polysilicon film 58 in the vicinity of the gate interconnect STGL1 which is in the ON state is lowered. In this case, in the vicinity of the not-selected sell USMC, a current at a substantially identical level can be caused to flow not in the phase-change material layer 16 but in the channel polysilicon film 58 irrespective of the state of the phase-change material layer 16 in the not-selected cell USMC. In the selected cell SMC, since the transistor is in the OFF state, the current flows in the phase-change material layer 16 as shown by the arrow in FIG. 26.

In the reset operation and the set operation, the operation is conducted by changing the state of the phase-change material layer 16 by the current flowing through the phase-change material 16 in the selected cell SMC thereby changing the resistance value. In the read operation, the operation is conducted by determining the current value flowing through the phase-change material layer 16 in the selected cell SMC.

In the memory cell blocks in plurality of other not illustrated holes HL, even for a memory cell of the memory cell block applied with the potential identical with that of the bit line BL1 in FIG. 26 to the metal interconnect M1, when the selection transistor having the fourth polysilicon film 64 adjacent with the hole HL having the memory cell block is in an OFF state, current does not flow to the memory cells in the memory cell block. Further, in the memory cell blocks in plurality of other not illustrated holes HL, even when the selection transistor having the fourth polysilicon film 64 adjacent to the hole HL having memory cell is in the OFF state, if there is no potential difference between the bit line BL1 over the memory cell block and the interconnect FL1 below the memory cell block, current does not flow to the memory cell in the memory cell block. Accordingly, since the current flows to the phase-change material layer 16 only through the phase-change material layer 16 in the vicinity of the selected cell SMC, selective operation is possible.

Figure 28:
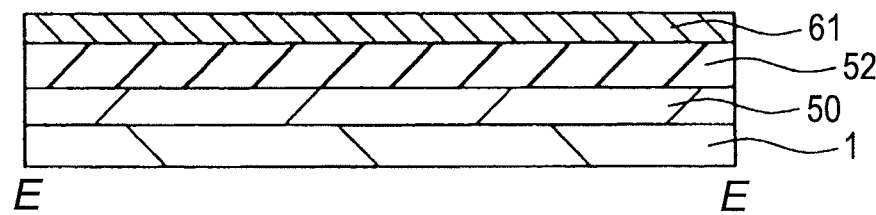
FIG. 28 is a cross sectional view for a main portion showing a method for manufacturing the phase-change memory as the second embodiment of the invention.
Figure 29:
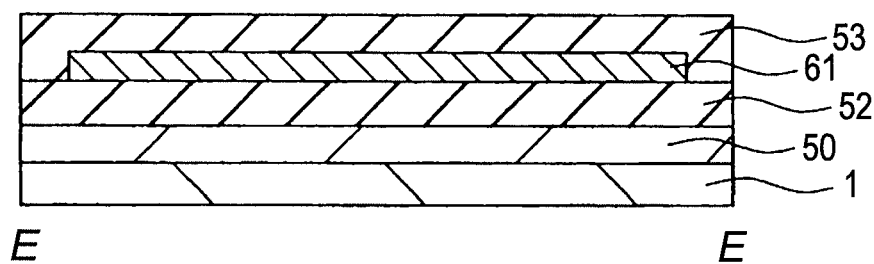
FIG. 29 is a cross sectional view for a main portion explaining the method for manufacturing a semiconductor device succeeding to FIG. 28.
Figure 30:
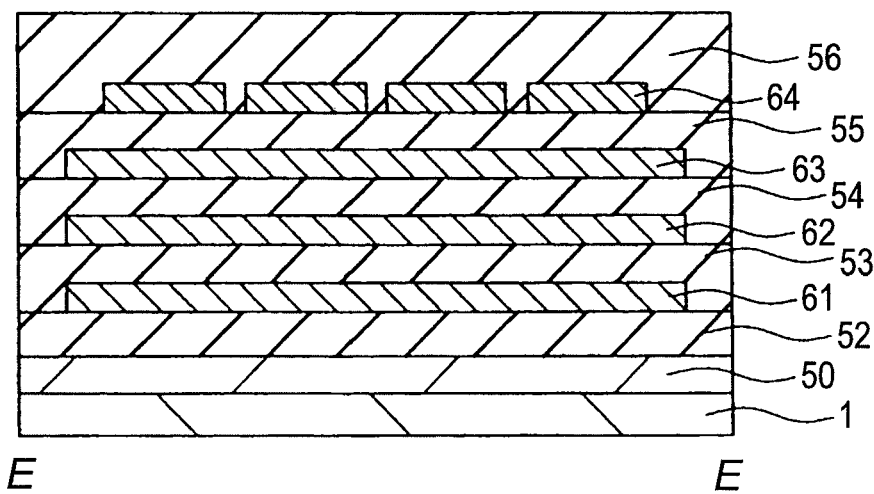
FIG. 30 is a cross sectional view for a main portion explaining the method for manufacturing the semiconductor device succeeding to FIG. 29.
Figure 31:
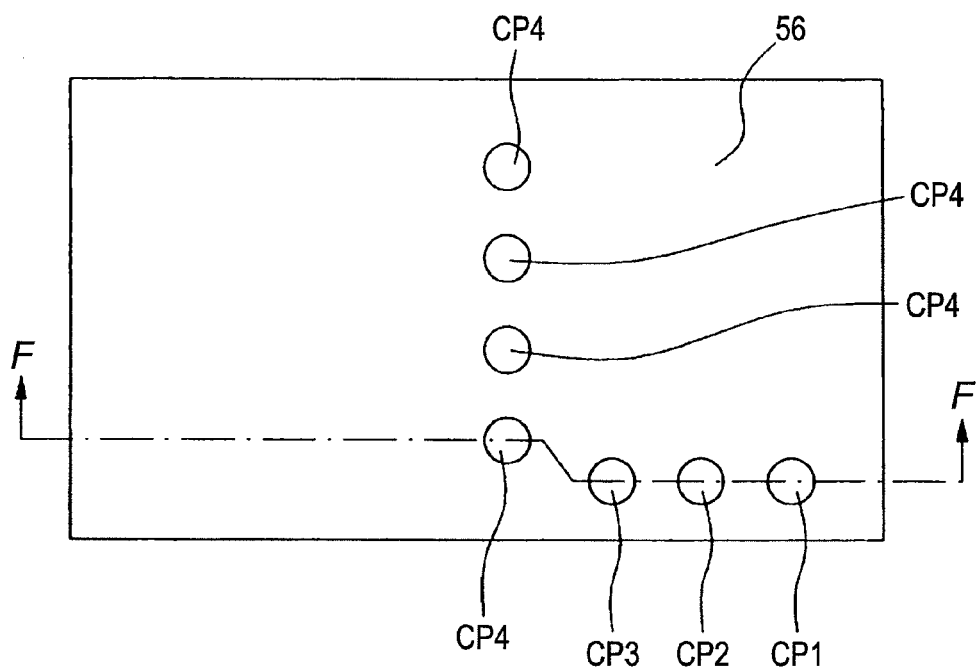
FIG. 31 is a cross sectional view for a main portion explaining the method for manufacturing the semiconductor device succeeding to FIG. 30.
Figure 32:
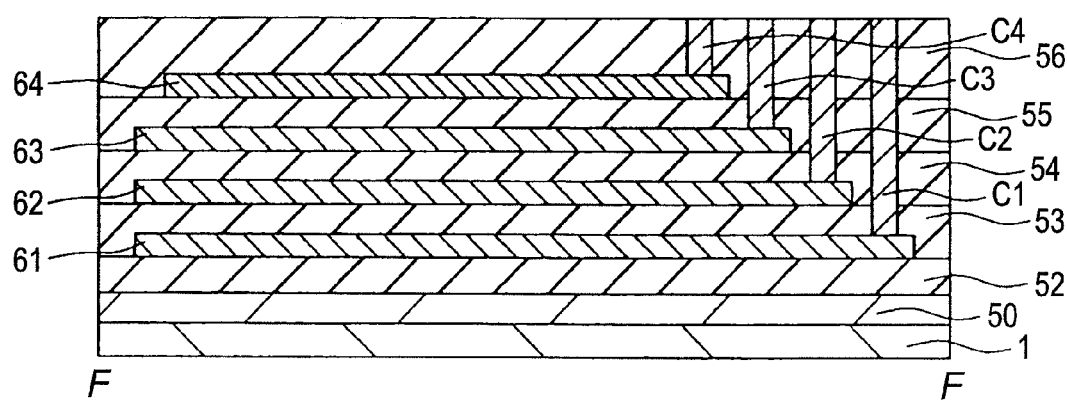
FIG. 32 is a cross sectional view for a main portion along line F-F in FIG. 31.
Figure 33:
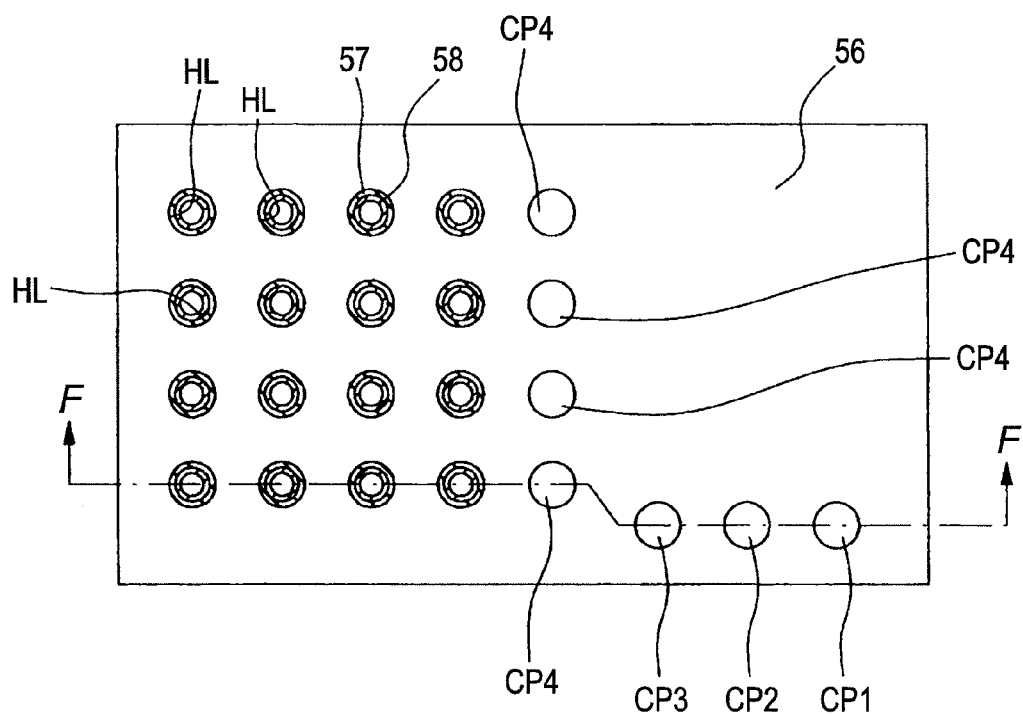
FIG. 33 is a plan view explaining the method for manufacturing the semiconductor device succeeding to FIG. 31.
Figure 34:
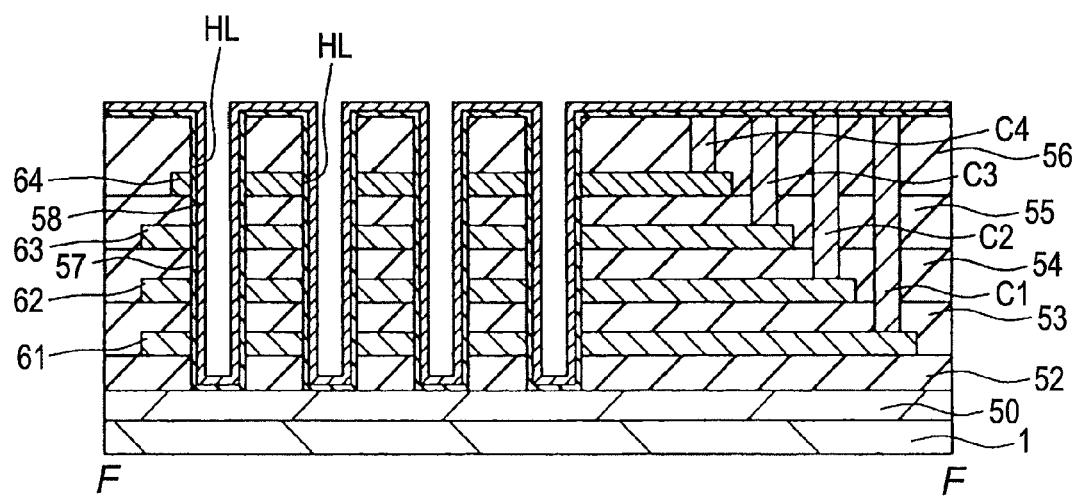
FIG. 34 is a cross sectional view for a main portion along line F-F in FIG. 33.
Figure 35:
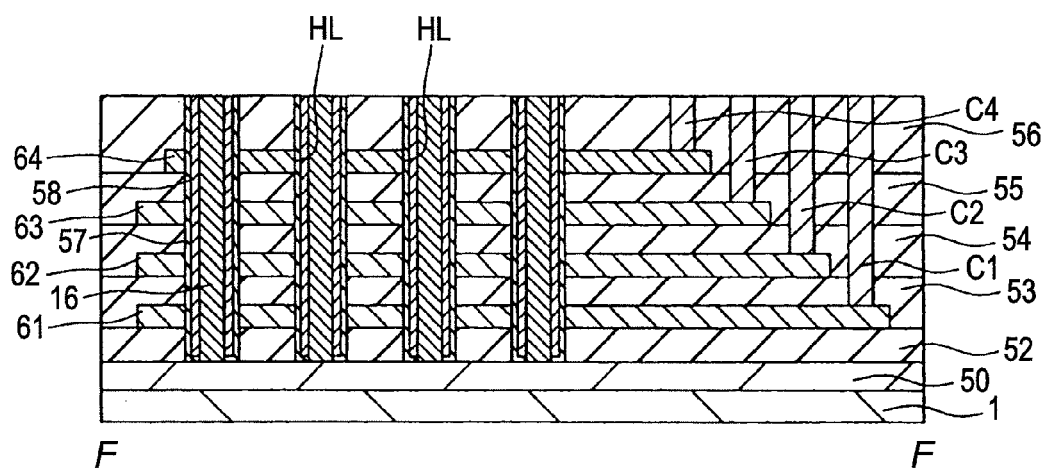
FIG. 35 is a cross sectional view for a main portion explaining the method for manufacturing the semiconductor device succeeding to FIG. 34.
Figure 36:
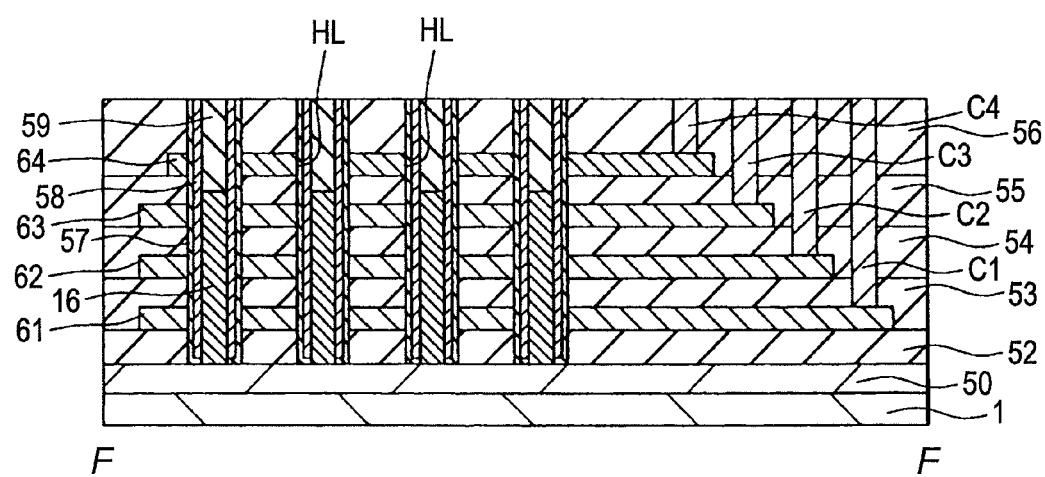
FIG. 36 is a cross sectional view for a main portion explaining the method for manufacturing the semiconductor device succeeding to FIG. 35.
Figure 37:
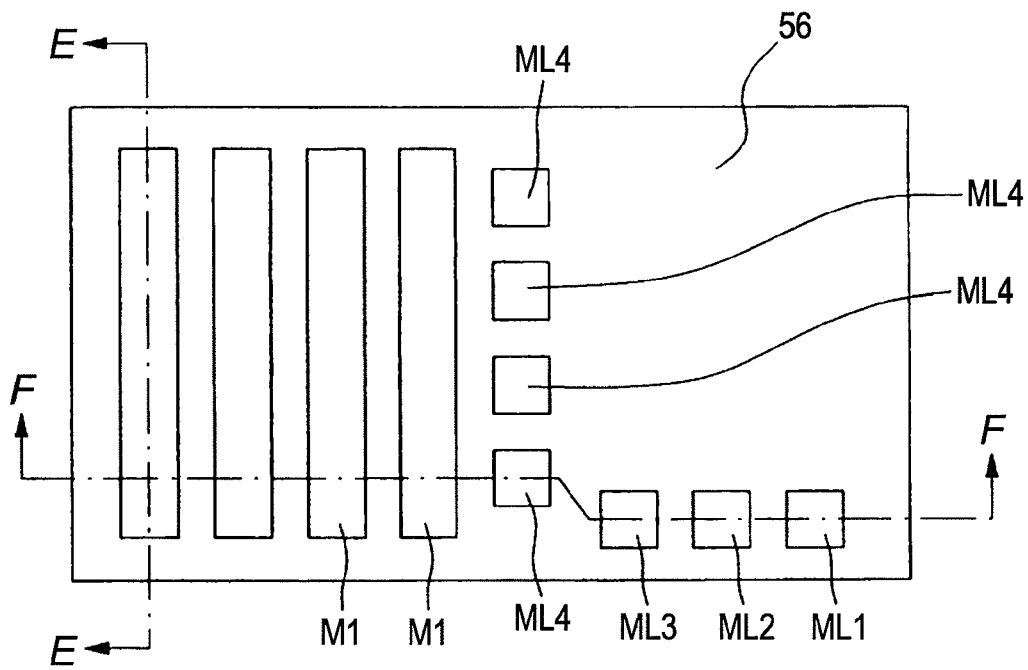
FIG. 37 is a plan view explaining the method for manufacturing the semiconductor device succeeding to FIG. 36.
Figure 38:
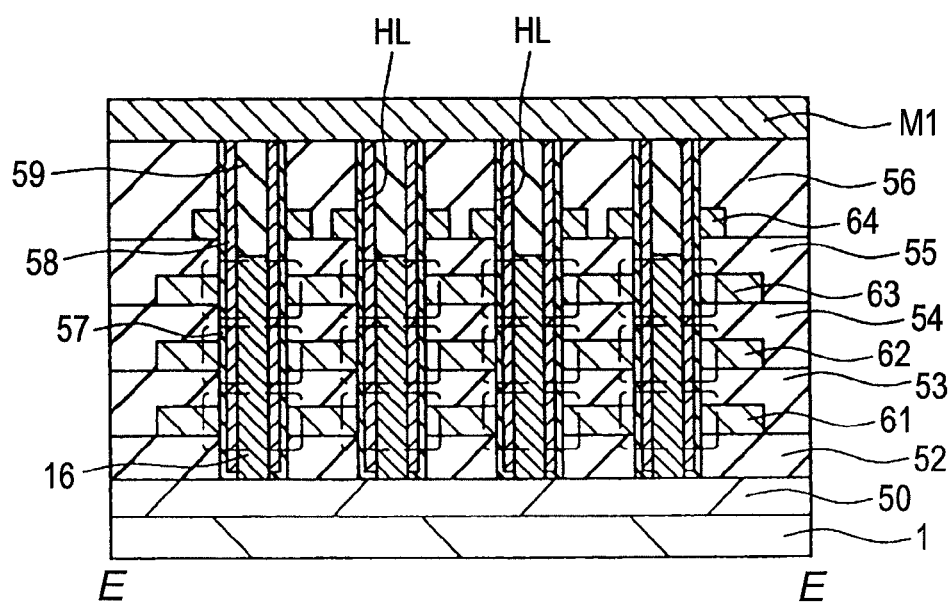
FIG. 38 is a cross sectional view for a main portion along line E-E in FIG. 37.
Figure 39:
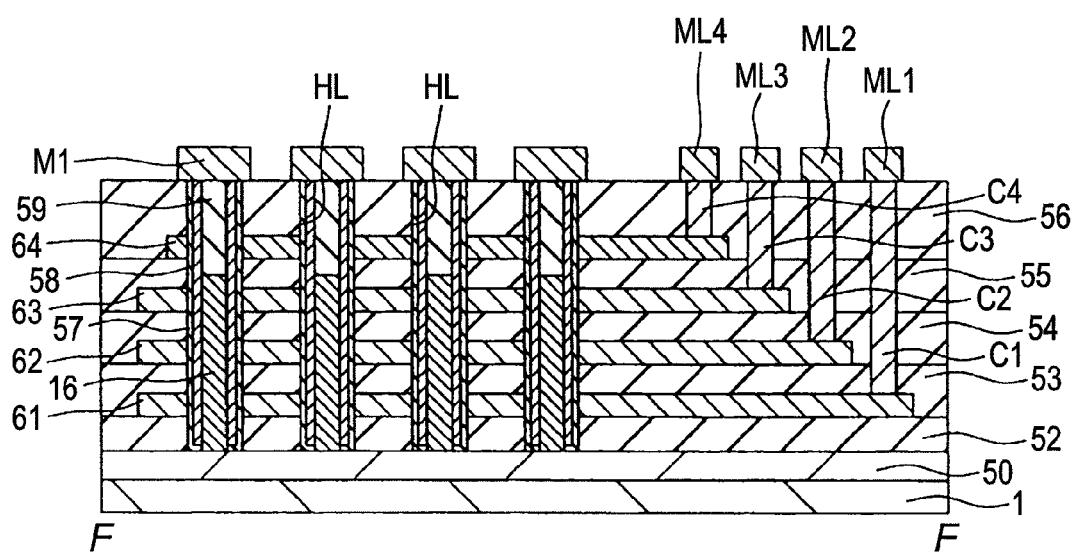
FIG. 39 is a cross sectional view for a main portion along line F-F in FIG. 37.
Figure 40:
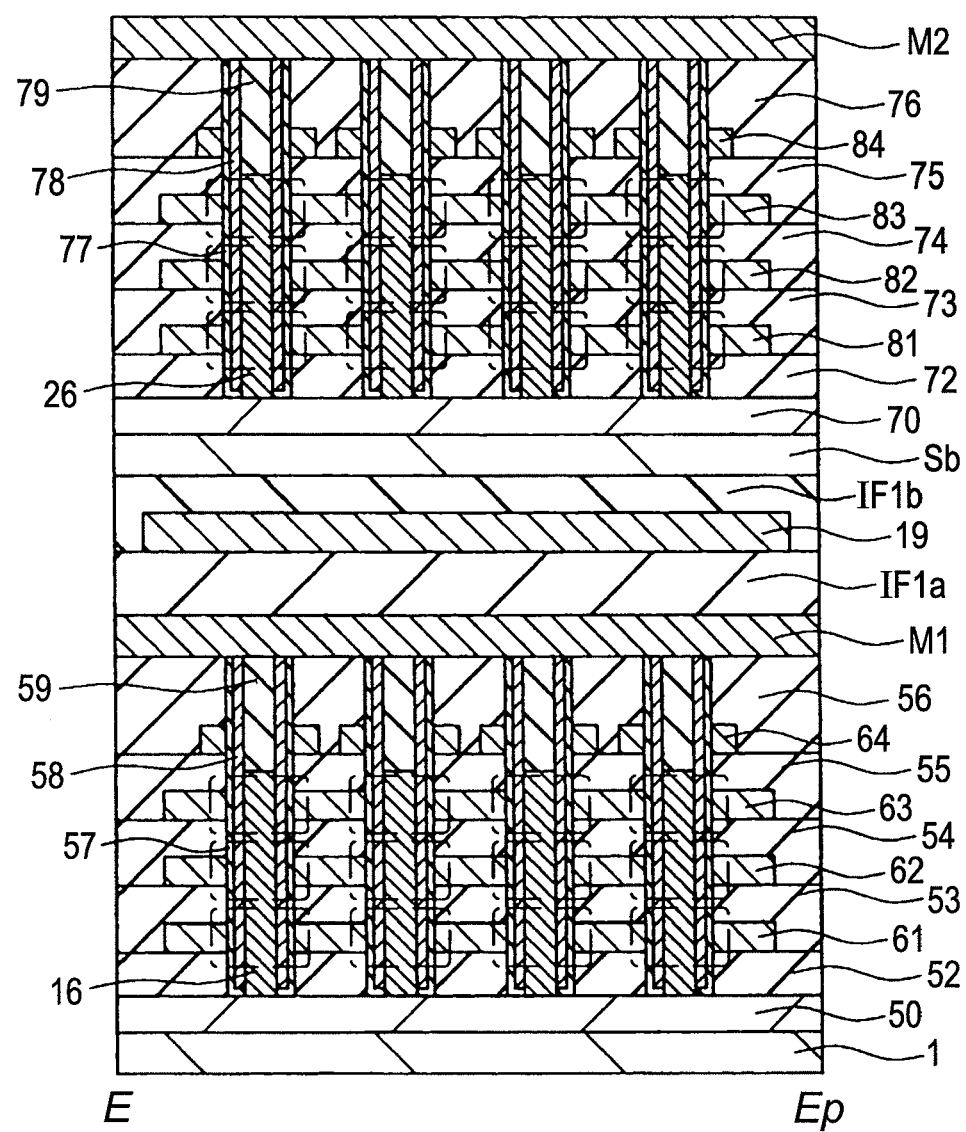
FIG. 40 is a cross sectional view for a main portion explaining a method for manufacturing a semiconductor device succeeding to FIG. 37.

Then, a method for manufacturing a semiconductor device of this embodiment is to be described with reference to FIG. 28 to FIG. 40. FIG. 28 to FIG. 30 are cross sectional views for main portions at a position identical with the cross section along line E-E in FIG. 23. FIG. 31, FIG. 33, and FIG. 37 are plan views of a semiconductor device during a manufacturing process, FIG. 32 and FIG. 34 are respectively cross sectional views for main portions along line F-F in FIG. 21 and FIG. 33. FIG. 35, FIG. 36, and FIG. 39 are cross sectional views for main portions on the identical cross section with FIG. 34. FIG. 38 and FIG. 40 are cross sectional views for main portions on the identical cross section with FIG. 30.

At first, as shown in FIG. 28, an impurity diffusion layer 50 as a contact layer of a memory cell block on the side of a substrate, an insulating film 52, and a first polysilicon film 61 are formed successively over a semiconductor substrate 1 including a peripheral circuit. FIG. 28 is a cross sectional view at a position identical with the cross section along line E-E in FIG. 23. The impurity diffusion layer 50 is a semiconductor layer comprised of, for example, a silicon film deposited by a CVD method, or a semiconductor layer formed by ion implanting an n-type impurity (for example, P (phosphorus)) into the upper surface of the semiconductor substrate 1. The insulating film 52 comprises, for example, a silicon oxide film and is formed by using, for example, a CVD method. The first polysilicon film 61 is a polysilicon film containing an n-type impurity (for example, P (phosphorus)) as the impurity and is formed by depositing as an amorphous silicon film by using, for example, a CVD method and then crystallizing the same by laser annealing. The first polysilicon film 61 has a function as a selection gate of the selection transistor, that is, a word line and the thickness thereof is preferably 30 nm or more and 100 nm or less.

Tungsten silicide, titanium silicide, cobalt silicide, nickel silicide or the like may also be formed on the impurity diffusion layer 50 for lowering the contact resistance by using a well-known salicide technique. Since the phase-change material layer is not yet formed over the semiconductor substrate 1 in this step, it is not necessary to use a laser annealing for decreasing thermal load, and crystallization of the polysilicon and activation of the impurity may be conducted by a heating furnace using lamps, etc. Further, the first polysilicon layer 61 can also be formed by the deposition in a state of polysilicon that requires higher temperature. However, when the polysilicon film that configures the memory matrix at and after the second layer is formed, the laser annealing is essential as will be described later. In this embodiment, the first polysilicon film 61 is crystallized by using the laser annealing identical with that used at and after the second layer in the step in FIG. 40 for making the characteristic of the selection transistor in the memory matrix uniform at or after the first layer.

Then, as shown in FIG. 29, the first polysilicon film 61 is fabricated by using photolithography and dry etching to form a gate structure comprised of the first polysilicon film 61. Then, an insulating film 53 is formed over the first polysilicon film 61 in the same method as for the insulating film 52 and, successively, the upper surface of the insulating film 53 is polished and planarized by using a CMP method. The first polysilicon film 61 is formed so as to be adjacent with a memory matrix formed in a layer identical with the first polysilicon film 61 in the subsequent step. That is, the first polysilicon film 61 has a pattern of a global structure in adjacent with each of the memory cells formed in a matrix.

Then, as shown in FIG. 30, the steps explained in FIG. 28 and FIG. 29 are repeated, and a second polysilicon film 62, an insulating film 54, a third polysilicon film 63, an insulating film 55, a fourth polysilicon film 64, and an insulating film 56 are formed successively over the insulating film 53. That is, steps of forming a patterned polysilicon film over the insulating film 53, then forming an insulating film so as to cover the polysilicon film over the polysilicon film, and then planarizing the upper surface of the insulating film are repeated.

In this step, the fourth polysilicon film 64 at the uppermost layer is formed into a stripe shape extending in the first direction different from the first polysilicon film 61 to the third polysilicon film 63 in the layers below the fourth polysilicon film 64. For operating the fourth polysilicon film 64 at the uppermost layer as a selection transistor for selecting the memory cell block in a three-dimensional memory cell array, the selection gate for the fourth polysilicon film 64 has to be formed as a fine selection gate structure different from three layers of polysilicon films having the global structure below the fourth polysilicon film 64. That is, it is patterned such that multiple fourth polysilicon films 64 formed respectively in the stripe shape are plurality of independent interconnects for selecting a portion of multiple memory cell blocks to be formed later. The fourth polysilicon film 64 conducts selecting operation for the memory cell block in cooperation with the metal interconnect M1 as the bit line shown in FIG. 24.

The material for the selection gate of the selection transistor, that is, the first polysilicon film 61 to the fourth polysilicon film 64 as the word line may be formed of a metal. The metal interconnect comprised of the metal includes, for example, W (tungsten) or TiN (titanium nitride) and is formed by using a well known technique such as a CVD method or sputtering. The thickness of the metal interconnect is preferably 30 nm or more and 100 nm or less. When the thickness of the metal interconnect is excessively thin, the interconnect resistance is increased. When it is excessively thick, shape control after the subsequent fabrication is difficult. Also with a view point of a driving voltage, since the driving voltage may be lower as the volume for rewriting the phase-change material (changing the state) is smaller, it is preferred that the thickness of the metal interconnect is not excessively thick. Further, the material for the insulating films 52 to 56, the first polysilicon film 61 to the fourth polysilicon film 64 and the metal film is preferably a material of low thermal conductivity since the driving voltage of the phase-change memory can be lowered.

Then, as shown in FIG. 31 and FIG. 32, after forming multiple contact holes extending from the upper surface of the insulating film 56 and reaching the upper surface for each of the first polysilicon film 61 to the fourth polysilicon film 64 by dry etching using photolithography, multiple contact plugs C1 to C4 filling the inside of each of the contact holes are formed. The contact plugs C1 to C4 comprise a tungsten film formed by the CVD method in the contact holes and over insulating film 56 and are formed by removing the tungsten film formed on the insulating film 56 by a CMP method to expose the upper surface of the insulating film 56. The contact plug C1 is electrically connected with the first polysilicon film 61, the contact plug C2 is electrically connected with the second polysilicon film 62, the contact plug C3 is electrically connected with the third polysilicon film 63, and multiple contact plugs C4 are electrically connected with multiple fourth polysilicon films 64 respectively. As shown in FIG. 31, the contact plugs CP4 are formed in a row in the second direction, while the contact plugs C1 to C3 are formed in a row in the first direction.

Then, as shown in FIG. 33 and FIG. 34, multiple holes HL for forming a memory cell block are formed by using photolithography and dry etching. The holes HL extend from the upper surface of the insulating film 56 and reach the upper surface of the impurity diffusion layer 50, and are formed in plurality in a matrix as shown in FIG. 33. While the planar shape of the hole HL is preferably a normal circular shape but it may be other shape such as a square shape, rectangular shape, or a trigonal shape. A plurality levels of threshold voltages and a plurality levels ON current of transistor can be provided for one identical selection transistor in accordance with the planar shape of the hole HL. That is, electric current for multiple resistance elements can be provided in one memory unit cell, which enables multi-value memory operation.

Then, an insulating film 57 and a channel polysilicon film 58 are formed successively on the insulating film 56, on the inner wall and at the bottom of the hole HL. In this step, inside of the hole HL is not filled completely. In FIG. 33, the insulating film 57 and the channel polysilicon film 58 formed over the insulating film 56 are not illustrated and the insulating film 57 and the channel polysilicon film 58 are shown only for those formed inside the hole HL.

The insulating film 56 is a film that functions as a gate insulating film of the selection transistor and comprises a silicon oxide film formed by a CVD method or an ISSG method, or a high-k insulating film formed by an ALCVD (Atomic Layer CVD) method. For forming the phase-change material layer inside the hole HL, it is important that the insulating film 57 and the channel polysilicon film 58 are deposited while being provided with anisotropy only to the inner wall of the hole HL and the ALCVD method is used preferably.

The channel polysilicon film 58 is a semiconductor layer that functions as the channel of the selection transistor, comprises a polysilicon containing an n-type impurity (for example, P (phosphorus)), and is formed by deposition by a CVD method or the like as an amorphous silicon film and then crystallization by laser annealing. The channel polysilicon film 58 has a high impurity concentration in a layer identical with the insulating films 52 and 56 than the channel polysilicon film 58 in other regions and is operated as a source-drain region of the selection transistor. The impurity concentration in the source-drain region is preferably $1 \times 10^{18}$ cm$^{-3}$ or more. Further, the impurity concentration of the channel polysilicon film 58 is lowered in a region that functions as the channel of the selection transistor (region in the layer identical with the first polysilicon film 61 to the fourth polysilicon film 64). The impurity concentration of the channel polysilicon film 58 in a region that functions as the channel of the selection transistor is preferably $1 \times 10^{18}$ cm$^{-3}$ or less. As a method of forming the channel polysilicon film 50 having the impurity concentration which is different depending on the region, a method of depositing an amorphous silicon film while changing the concentration of the introduced impurity (for example, P (phosphorus)) in the sequence of depositing the amorphous silicon film when the channel polysilicon film 58 is formed by a CVD method is convenient and preferred.

Since the phase-change material layer is yet not formed in this stage, it is not necessary to crystallize the channel polysilicon film 58 by the laser annealing with an aim of reducing thermal load but the amorphous silicon film may be crystallized and the impurity may be activated by a heating furnace using lamps, etc. Alternatively, the channel polysilicon film 58 may also be formed by deposition in a polysilicon state that requires higher temperature. However, when the channel polysilicon film of the memory array at and after the second layer is manufactured, the laser annealing is essential as to be described later. In this embodiment, the channel polysilicon film 58 is crystallized by using the laser annealing identical with that used at and after the second layer in the step of FIG. 40 in order to make the characteristic of selection transistors uniform at and after the first layer uniform.

Then, as shown in FIG. 35, a phase-change material layer 16 is formed over the channel polysilicon film 58 and inside the hole HL. The phase-change material layer 16 comprises, for example, $Ge_2Sb_2Te_5$ and is formed by using an ALCVD method or a sputtering method. As other phase-change materials, phase-change materials having a performance at an identical level can be obtained by selecting compositions of materials containing at least one element of chalcogen elements (S (sulfur), Se (selenium), and Te (tellurium)). The thickness of the phase-change material layer 16 is 5 nm or more and 300 nm or less.

Before forming the phase-change material layer 16, it is preferred to perform sputter etching previously and remove the insulating film 57 and the channel polysilicon film 58 formed at the bottom of the hole Hl to expose the upper surface of the impurity diffusion layer 50, thereby improving the contact between the impurity diffusion layer 50 and the phase-change material layer 16. Successively, the insulating film 57, the channel polysilicon film 58, and the phase-change material layer 16 are polished by a CMP method to expose the upper surface of the insulating film 56.

Then, as shown in FIG. 36, for providing the memory cell block with the selectivity only in the transistor portion as a first node, the phase-change material layer 16 inside the hole HL is removed by a dry etching method. That is, the upper surface of the phase-change material layer 16 inside the hole HL is etched back to make the height of the upper surface of the phase-change material layer 16 identical with the height of the insulating film 55 at the identical layer. In other words, the upper surface of the phase-change material layer 16 is etched back such that the height of the upper surface of the phase-change material layer 16 is lower than the lower surface of the fourth polysilicon film 64 and higher than the upper surface of the third polysilicon layer 63. Thus, since the selection transistor at the uppermost layer in the memory matrix contains no phase-change material layer 16, only the current flowing to the selection transistor at the uppermost layer can be controlled by the voltage control of the word line of the selection transistor at the uppermost layer, by which memory cell block can be selected and operated.

Then, as shown in FIG. 37 to FIG. 39, after forming the insulating film 59 over the phase-change material layer 16 and over the insulating film 56 the insulating film 59 is polished by a CMP method to expose the upper surface of the insulating film 56 thereby filling the inside of the hole HL with the insulating film 59. Successively, after forming a tungsten film over the insulating film 56, over the insulating film 59, over the insulating film 57, over the channel polysilicon film 58, and over the contact plugs C1 to C4 by a CVD method or a sputtering method, the tungsten film is patterned by using photolithography and dry etching to form metal interconnect M1 and interconnects ML1 to ML4 comprised of the tungsten film.

The metal interconnects M1 have a bit line pattern of a memory, formed over the insulating film 56, over the insulating film 59, over the insulating film 57, and over the channel polysilicon film 58, and have a stripe shape pattern extending in the second direction. That is, each of the metal interconnects M1 is electrically connected with a channel polysilicon film 58 of multiple memory cell blocks arranged in the second direction and formed while extending in the second direction so as to cover the upper surface of the memory cell blocks arranged in the second direction. The interconnects ML1 to ML4 are metal films formed over the contact plugs C1 to C4 respectively, and the interconnects ML1 to ML4 are insulated from each other. Further, while each of the selection gates (first polysilicon film 61 to the fourth polysilicon film 64) and the bit line (metal interconnects) M1 are electrically connected with the semiconductor substrate 1 including the peripheral circuit for writing, erasing, and reading the phase-change memory, they are not illustrated.

Thus, the memory matrix at the first layer is formed. In this embodiment, while description has been made to a stacked memory formed by stacking three layers in a direction perpendicular to the main surface of the semiconductor substrate 1 in each of the memory cell blocks, layers of the memory cell in the memory cell block may be stacked by any number other than three.

Then, as shown in FIG. 40, the semiconductor device of this embodiment is completed by stacking a memory matrix at the second layer having the identical structure over a memory matrix at the first layer formed by the steps described above in order to increase the bit density of the memory cell. In this case, a metal film 19 overlapping the memory matrix at the first layer in view of a plane and covered with the interlayer insulating film IF1a and the interlayer insulating film IF1b is formed between the memory matrix at the first layer and the memory matrix at the second layer formed over the first layer in the same manner as in the first embodiment. The metal film 19, the interlayer insulating film IF1a, and the interlayer insulating film IF1b are formed in the same manner as in the steps explained with reference to FIG. 16 to FIG. 18 for the first embodiment.

That is, the interlayer insulating film IF1a is deposited over the entire surface of the semiconductor substrate 1 by a CVD method, to cover the surface of the metal interconnect M1 and the interconnects ML1 to ML4 with the interlayer insulating film IF1a. Then, the upper surface of the interlayer insulating film IF1a is polished and planarized by a CMP method and, successively, a metal film 19 comprised of, for example, TiN (titanium nitride) is deposited over the interlayer insulating film IF1a by a sputtering method, and then patterned by using photolithography and dry etching. In this step, the metal film 19 is formed in a region overlapping the memory matrix including the phase-change material layer 16 below the metal film 19 in view of a plane. Successively, the interlayer insulating film IF1b is deposited over the interlayer insulating film IF1a and over the metal layer 19 by a CVD method to cover the surface of the metal film 19 with the interlayer insulating film IF1b and then the upper surface of the interlayer insulating film IF1b is polished and planarized by a CMP method.

Then, the subsequent memory matrix at the second layer can be formed by the steps identical with those in the memory matrix at the first layer. That is, after forming an impurity diffusion layer 70 similar to the impurity diffusion layer 50 of the memory matrix at the first layer over the interlayer insulating film IF1b, a memory matrix is formed over the impurity diffusion layer 70. When a first polysilicon layer 81 to a fourth polysilicon layer 84 in the memory matrix at the second layer similar to the first polysilicon silicon film 61 to the fourth polysilicon film 64 in the memory matrix at the first layer are formed, amorphous silicon films are formed respectively, and then crystallized into a polysilicon state by annealing by a $CO_2$ laser, thereby forming the first polysilicon film 81 to the fourth polysilicon film 84. Further, when a channel polysilicon film 78 in the memory matrix at the second layer is formed, an amorphous silicon film is formed and then crystallized into a polysilicon state by annealing by the $CO_2$ laser thereby forming the channel polysilicon layer 78.

In the annealing treatment of crystallizing the amorphous silicon film, use of a short wavelength laser such as an excimer laser or a YAG laser may also be considered. However, in the use of the laser at the short wavelength, since the wavelength is short, the light absorption length is short and the amorphous silicon can be crystallized only for a depth of about 300 nm from the upper surface to the lower surface of the semiconductor device during the manufacturing process, so that the number of stackings of the memory cell in the memory matrix at each of the layers is restricted. Further, when annealing by the laser at the short wavelength is used upon forming the memory matrices at and after the second layer, since all of silicon is melted and then recrystallized, the heat absorption amount to the metal film 19 is increased excessively and one of the effects of the invention of preventing the degradation of the characteristic of the phase-change memory of the memory cell at the lower layer is decreased. Therefore, in this embodiment, the amorphous silicon film is crystallized by using, for example, a $CO_2$ laser (wavelength: 10.6 μm). The absorption length of the laser light of the $CO_2$ laser as a long wavelength laser is as long as 20 μm and the number of stacked layers of the memory cell in the memory matrix at each of the layers has no restriction within a practical range.

Further, while an n-type MOS transistor is used as the selection transistor in this embodiment, a p-type MOS transistor may also be used. In this case, an n-type semiconductor substrate is used for the semiconductor substrate 1 and a $p^+$-type semiconductor layer is used for the impurity diffusion layers 50 and 70 and the channel polysilicon film 58 and 78.

Further, while the number of stacked layers of the matrices in the memory matrix is only two layers in this embodiment, the number of stacked layers is not restricted thereto but the number of stacked layers of the memory matrices may be more than two. When multiple memory matrices are stacked, a metal film 19 is formed between the memory matrix at the upper layer and the memory matrix at the lower layer in the same manner as in FIG. 40.

In this embodiment, description has been made to a semiconductor device formed by stacking a plurality layers of memory matrices each having a phase-change memory having a vertical chain memory structure. In this embodiment, the metal film 19 is formed between the stacked memory matrices in the same manner as in the first embodiment described above. Thus, as described with reference to FIG. 40, in the laser annealing step for forming the polysilicon film in the memory matrix at the layer above the metal film 19 (for example, the first polysilicon film 81 to the second polysilicon film 82, or the channel polysilicon film 58), the phase-change material layer in the memory matrix at the layer below the metal film from being heated excessively by the laser. Further, when the insulating film 57 as the gate insulating film in each of the memory cells comprises a high-k insulating film, the metal film can prevent the insulating film 57 from being heated excessively to a high temperature by direct radiation of the laser to the insulating film 57 thereby deteriorating the characteristic of the high-k film that configures the insulating film 57 from being degraded. Accordingly, this can prevent the phase-change material layer of the memory matrix at each of the layers from melting or subliming. Further, this can also prevent lowering of the reliability of the gate insulating film in each of the memory cells. Therefore, the yield in the manufacturing process of the semiconductor device can be improved. Further, the reliability of the semiconductor device can be improved.

In this embodiment, by using a material having a thermal conductivity which is lower, for example, than the contact plugs C1 to C4 and the metal interconnect M1 for the material of the metal film 19 shown in FIG. 40, overheating of the metal film 19 by the laser is prevented, and excessive increase of the temperature of the memory matrix at the first layer by the heat possessed in the metal film 19 can be prevented in the same manner as in the first embodiment described above.

Third Embodiment

Figure 41:
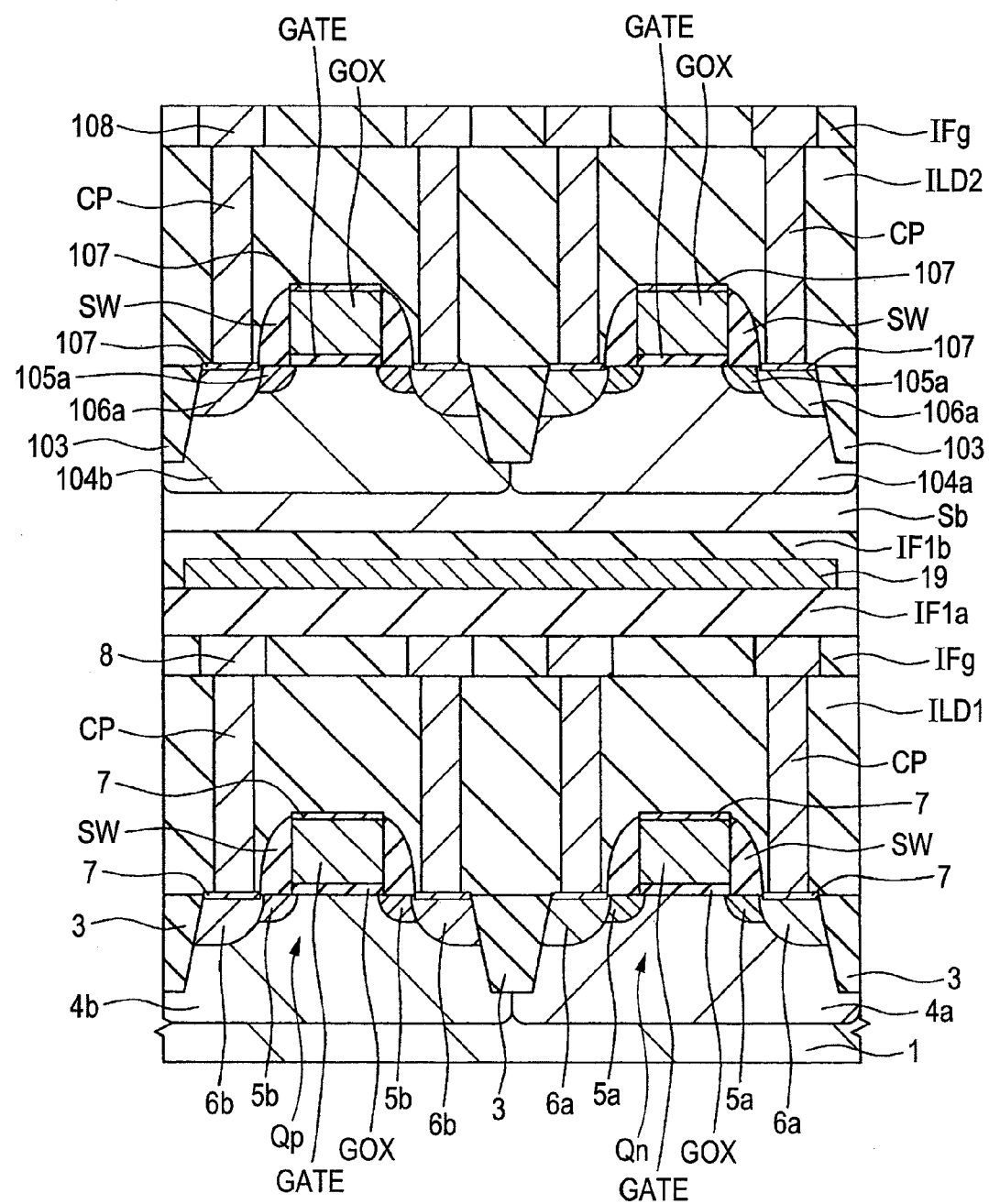
FIG. 41 is a cross sectional view for a main portion of a semiconductor device as a third embodiment of the invention.

In this embodiment, description is to be made to a semiconductor device having a logic circuit including CMISFET. FIG. 41 shows a semiconductor device of this embodiment. As shown in FIG. 41, CMISFET of this embodiment (hereinafter simply referred to as CMISFET) has a structure in which multiple CMISs are stacked over a semiconductor substrate 1. Multiple device isolation regions 3 are formed in the upper surface of the semiconductor substrate 1, and a p-well 4a or an n-well 4b is formed in the upper surface of the semiconductor substrate 1 between the device isolation regions 3. A gate electrode GATE is formed over the p-well 4a and over the n-well 4b respectively by way of a gate insulating film GOX, and a side wall SW is formed on the side wall of the gate electrode GATE. The side wall SW is an insulating film comprised of, for example, silicon oxide, silicon nitride, or a stacked film thereof, and extension regions 5a, 5b are formed to the respective upper surfaces of the p-wall 4a and the n-wall 4b below the side wall SW respectively.

Impurity diffusion layers 6a and 6b are formed in the upper surface of the semiconductor substrate 1 between the extension regions 5a and 5b and the device isolation region 3 excluding the portion below the gate electrode GATE and the portion below the side wall SW. The extension regions 5a and 5b comprise an n⁻-type semiconductor region and a p⁻-type semiconductor region respectively, and the impurity diffusion layers 6a and 6b comprise an n⁺-type semiconductor region and a p⁺-type semiconductor region respectively. That is, the extension region 5a and the impurity diffusion layer 6a and the extension region 5b and the impurity diffusion layer 6b have LDD (lightly doped drain) structure, respectively, and the impurity diffusion layers 6a and 6b are layers that function as the source-drain region of MISFET.

A silicide layer 7 is formed at the upper surface of the gate electrode GATE and the upper surface of the impurity diffusion layers 6a and 6b respectively, and an interlayer insulating film ILD1 is formed over the semiconductor substrate 1 so as to cover the gate electrode GATE. Multiple contact holes extending from the upper surface of the interlayer insulating film ILD1 and reaching the silicide layer 7 are formed in the interlayer insulating film ILD1, and contact plugs CP mainly containing tungsten are filled inside of the contact holes. An interlayer insulating film IFg is disposed over the interlayer insulating film ILD1 and over the contact plug CP and multiple metal interconnects 8 are formed between the insulating film IFg by a damascene method. Each of the metal interconnects 8 is electrically connected with the impurity diffusion layer 6a or 6b by way of the contact plug CP and the silicide layer 7.

As described over, an n-type MISFET (nMIS) Qn having the gate electrode GATE, the gate insulating film GOX, the extension region 5a, and the impurity diffusion layer 6a is formed over the p-well 4a, and a p-type MISFET (pMIS) Qp having the gate electrode GATE, the gate insulating film GOX, the extension region 5b, and the impurity diffusion layer 6b is formed over the n-well 4b. The n-type MISFET (nMIS) $Q_M$ and the p-type MISFET (nMIS) Qp configure a CMIS at the first layer.

Further, over the metal interconnect 8 and over the insulating film IFg, an interlayer insulating film IF1a, metal film 19, and an interlayer insulating film IF1b are formed successively. Over the interlayer insulating film IF1b, a silicon film Sb in a polysilicon state corresponding to the semiconductor substrate 1 of the CMIS at the first layer is formed, and CMIS at the second layer having the structure identical with the CMIS at the first layer is formed over the silicon film Sb with the silicon film Sb being as the substrate. That is, device isolation regions 103, a p-well 105a, and an n-well 105b are formed in the upper surface of the silicon film Sb, and an n-MISFET and a p-MISFET are formed over the p-well 105a and over the n-well 105b respectively.

Then, a method for manufacturing a semiconductor device of this embodiment is to be described with reference to FIG. 42 to FIG. 48. FIG. 42 to FIG. 48 show cross sectional views for a main portion of the CMIS during the manufacturing process of this embodiment.

Figure 42:
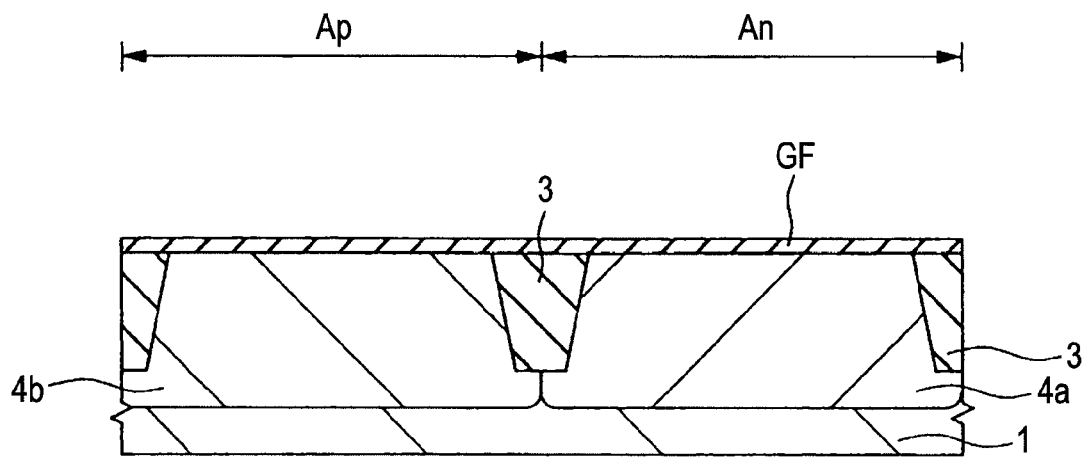
FIG. 42 is a cross sectional view for a main portion showing a method for manufacturing CMIS as the third embodiment of the invention.

At first, as shown in FIG. 42, device isolation regions 3 are formed in the main surface of a semiconductor substrate 1 comprised of a p-type single crystal silicon having a specific resistivity of about 1 to 10 Ωcm. The device isolation region 3 comprises silicon oxide or the like and is formed by an STI (Shallow Trench Isolation) method or an LOCOS (Local Oxidation) method or the like.

Then, a p-well 4a is formed in an nMIS forming region An as a region forming an n-channel type MISFET (hereinafter simply referred to as nMIS) over the semiconductor substrate 1 by an ion implantation method using photolithography. The p-well 4a is formed by ion implanting a p-type impurity (for example, B (boron)). Then, ion implantation is performed optionally to the surface layer portion of the p-well 4a and a heat treatment for activating the impurity introduced by the ion implantation is performed, thereby forming a threshold voltage control layer (not illustrated) for controlling the threshold voltage of an nMIS to be formed subsequently. Either p-well 4a or the n-well 4b may be formed first.

Successively, an n-well 4b is formed in a pMIS forming region Ap as a region forming a p-channel type MISFET (hereinafter simply referred to as pMIS) over the semiconductor substrate 1 by an ion implantation method using photolithography. The p-well 4b is formed by ion implanting an n-type impurity (for example, P (phosphorus)). Then, ion implantation is performed optionally to the surface layer portion of the n-well 4b and a heat treatment for activating the impurity introduced by the ion implantation is performed, thereby forming a threshold voltage control layer (not illustrated) for controlling the threshold voltage of the pMIS to be formed subsequently.

Successively, an insulating film GF is formed over the main surface of the semiconductor substrate 1. The insulative film GF comprises, for example, a thin silicon oxide film and can be formed, for example, by a thermal oxidation method. Also, the insulating film GF can be formed by nitriding the surface of a thermal oxide film by using an NO (nitrogen monoxide)

gas or the like as a stacked film of a silicon oxide film and a silicon nitride film thereon. Further, the insulating film GF can be formed also with a silicon oxynitride film. Further, the insulating film GF can also be formed of a high-k (high dielectric) insulating film such as of hafnium ($HfO_2$, HfSiO, HfSiON), zirconium ($ZrO_2$, ZrSiO, ZrSiON), alumina ($Al_2O_3$), etc. by using an AlCVD method or the like.

Figure 43:
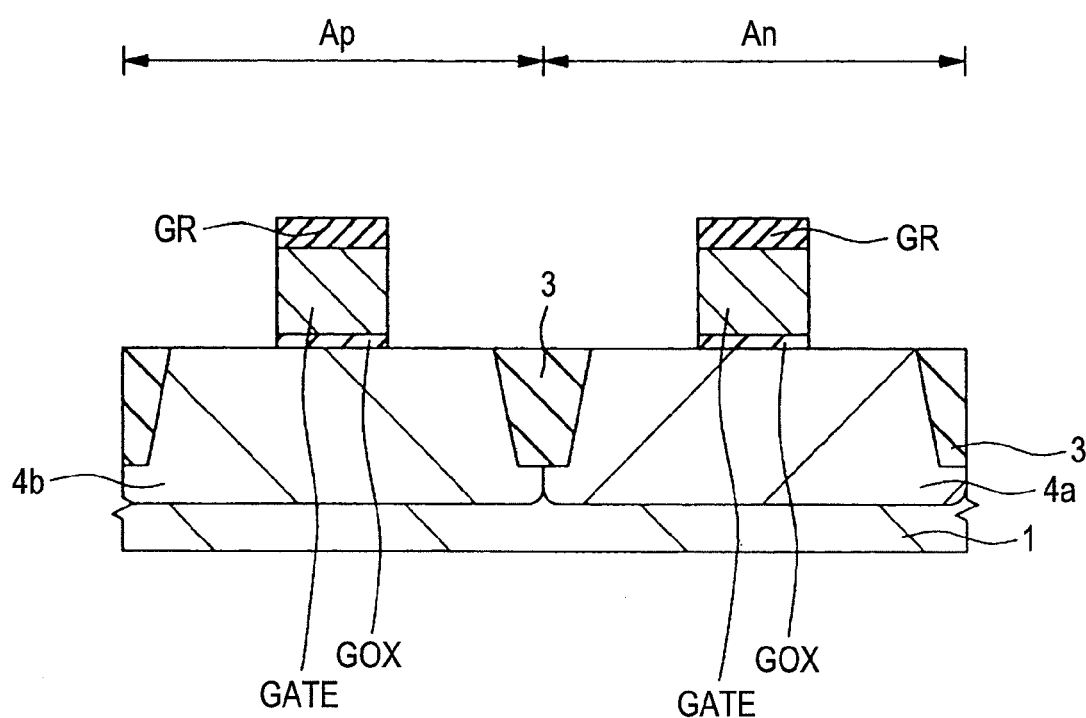
FIG. 43 is a cross sectional view for a main portion explaining the method for manufacturing a semiconductor device succeeding to FIG. 42.

Then as shown in FIG. 43, after forming a polysilicon film and a gate protective film GR successively over the insulating film GF, an impurity is introduced into the polysilicon film by using photolithography and ion implantation. Successively, by fabricating the gate protective film GR, the polysilicon film, and the insulating film GF using photolithography and dry etching, a gate electrode GATE comprised of a polysilicon film, and a gate insulating film GOX comprised of the insulating film GF is formed. The polysilicon film and the gate protective film GR are formed, for example, by a CVD method or the like. The material for the gate protective film GR is, for example, a silicon oxide film. The gate electrode GATE may also be formed by using a metal film, for example, of W (tungsten), WN (tungsten nitride), TiN (titanium nitride), and AlN (aluminum nitride).

Figure 44:
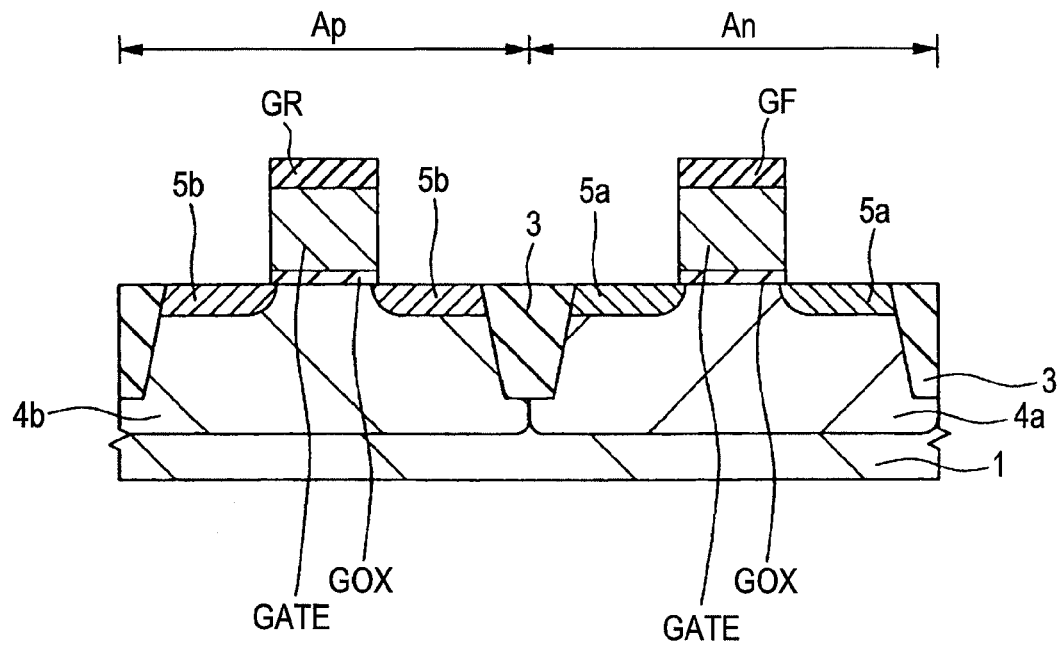
FIG. 44 is a cross sectional view for a main portion explaining the method for manufacturing the semiconductor device succeeding to FIG. 43.

Then, as shown in FIG. 44, an extension region 5a as an $n^-$-type semiconductor region is formed in the upper surface of the p-well 4a in the nMIS forming region An, and an extension region 5b as a $p^-$-type semiconductor region is formed in the upper surface of the n-well 4b in the pMIS forming region Ap by using photolithography and ion implantation.

The extension region 5a is formed by ion implantation of an n-type impurity (for example, As (arsenic)) into the upper surface of p-well 4a except for the portion below the gate electrode GATE. As ion implantation conditions, the acceleration energy is, for example, at about 3 keV and the implantation amount (dose amount) is, for example, at about $1 \times 10^{15}/cm^2$. Further, in the ion implantation step of forming the extension region 5a, the extension region 5a is formed in self alignment to the gate electrode GATE since the gate electrode GATE and the gate protective film GR function as an implantation inhibition mask.

In the same manner, an extension region 5b is formed in the upper surface of the n-well 4b by ion implantation of a p-type impurity (for example, B (boron)) into the upper surface of the n-well 4b. Since the pMIS forming region Ap is covered with a photoresist film in the ion implantation step forming the extension region 5a, and the nMIS forming region An is covered with a photoresist film in the ion implantation step forming the extension region 5b, the extension regions 5a and 5b can be prepared divisionally for the nMIS forming region An and the pMIS forming region Ap.

Figure 45:
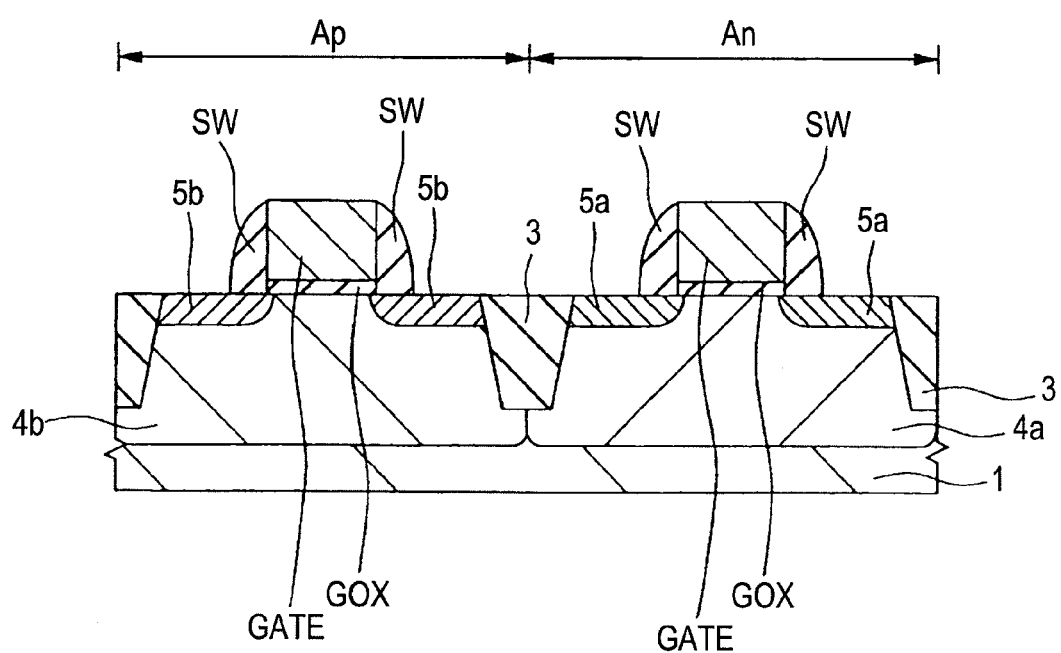
FIG. 45 is a cross sectional view for a main portion explaining the method for manufacturing the semiconductor device succeeding to FIG. 44.

Then, as shown in FIG. 45, after removing the gate protective film GR and after forming an insulating film so as to cover the surface of the gate electrode GATE and the upper surface of the semiconductor substrate 1, the insulating film is anisotropically etched to expose the upper surface of the semiconductor substrate 1 and the gate electrode GATE, and a side wall SW comprised of the insulating film is formed on the side wall of the gate electrode GATE. The insulating film is a film, for example, comprised of silicon oxide, silicon nitride, or a stacked film of them and is deposited by a CVD method.

Figure 46:
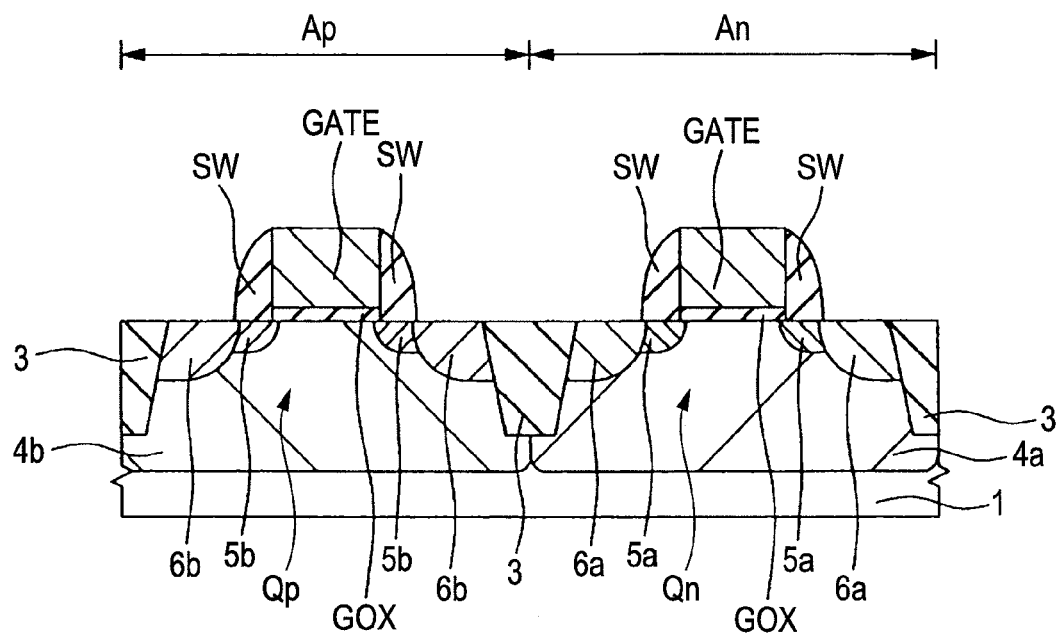
FIG. 46 is a cross sectional view for a main portion explaining the method for manufacturing the semiconductor device succeeding to FIG. 45.

Then, as shown in FIG. 46, an impurity diffusion layer 6a as an $n^+$-type semiconductor region is formed in the upper surface of the p-well 4a of the nMIS forming region and an impurity diffusion layer 6b as a $p^+$-type semiconductor region is formed in the upper surface of the n-well 4b of the pMIS forming region by using photolithography and ion implantation.

The impurity diffusion layer 6a is formed by ion implantation of an n-type impurity (for example, P (phosphorus)) in the upper surface of the p-well 4a by using the gate electrode GATE, the side wall SW, and a photoresist film formed over the pMIS forming region Ap as a mask. The ion implantation is performed in a direction perpendicular to the main surface of the semiconductor substrate 1. In the ion implantation, the acceleration energy is, for example, at about 10 keV and the implantation amount (dose amount) is, for example, at about $5 \times 10^{15}/cm^2$. Accordingly, the impurity concentration is higher in the impurity diffusion layer 6a than in the extension region 5a.

Further, the junction depth of the impurity diffusion layer 6a (depth in a direction perpendicular to the main surface of the semiconductor substrate 1) is larger than the junction depth of the extension region 5a (depth in a direction perpendicular to the main surface of the semiconductor substrate 1). That is, the extension region 5a has lower impurity concentration and is formed shallower compared with the impurity diffusion layer 6a.

Further, in the ion implantation step forming the impurity diffusion layer 6a, since the gate electrode GATE and the side wall SW function as an implantation inhibition mask, the impurity diffusion layer 6a is formed in self-alignment to the gate electrode GATE and the side wall SW.

Successively, by ion implantation of a p-type impurity (for example, B (boron)), the impurity diffusion layer 6b is formed in the same manner as the impurity diffusion layer 6a. Either the impurity diffusion 6a or the impurity diffusion 6b may be formed first.

Then, for activating the impurity introduced into the extension regions 5a and 5b and the impurity diffusion layers 6a and 6b, an annealing treatment by a laser at a long wavelength is performed to the nMIS forming region An and the pMIS forming region Ap under the condition at 1350° C. for 800 µs. In the laser annealing, for example, a $CO_2$ laser (wavelength: 10.6 µm) is used. The annealing treatment is performed in an atmosphere of $N_2$ (nitrogen) or other gas species (for example, inert gas).

By the annealing treatment, impurities introduced into the extension regions 5a and 5b and impurity diffusion layers 6a and 6b are activated. Thus, the nMISQn and the pMISQp are formed over the p-well 4a and over the n-well 4b. In the step of the annealing treatment for the extension region and the impurity diffusion layer that configures the CMIS at the first layer, it is not necessary to perform the laser annealing with an aim of reducing thermal load but the impurity may be activated by a heating furnace using lamps, etc. However, when the extension region and the impurity diffusion layer forming the CMIS at or after the second layer are activated, the laser annealing is essential as will be described later. In this embodiment, for making the characteristics of MISFETs at the first layer and at and after the second layer uniform, a laser annealing treatment identical with the annealing treatment to be performed at and after the second layer is used also for the activation step at the first layer.

Figure 47:
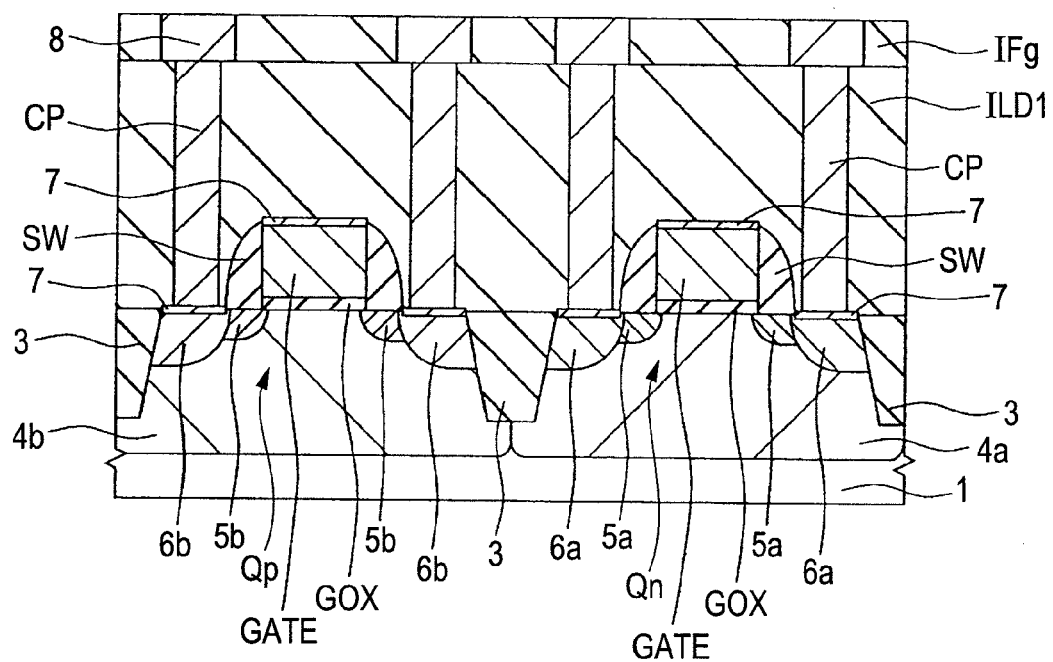
FIG. 47 is a cross sectional view for a main portion explaining the method for manufacturing the semiconductor device succeeding to FIG. 46.

Then, as shown in FIG. 47, a silicide layer 7 comprised of a nickel silicide (NiSi) is formed over the gate electrode GATE, over the impurity diffusion layer 6a, and over the impurity diffusion layer 6b by a well known salicide technique. Successively, after depositing an interlayer insulating film ILD1 over the entire surface of the semiconductor substrate 1 so as to cover the gate electrode GATE by a CVD method, the upper surface of the interlayer insulating film ILD1 is planarized by a CMP method. Successively, after forming contact holes formed extending from the upper surface of the interlayer insulating film ILD1 and reaching the silicide layer 7, a metal film mainly comprised of tungsten is formed inside the contact holes and over the interlayer insulating film ILD1, and the metal film is polished by a CMP method to expose the upper surface of the interlayer insulating film ILD1, thereby forming contact plugs CP extending from the upper surface of the interlayer insulating film ILD1 and reaching the upper surface of the silicide layer 7. Contact plugs formed over the gate electrodes GATE are not illustrated.

Successively, an insulating film IFg is formed over the interlayer insulating film ILD1 and over the contact plugs CP, and a metal interconnect 8 is formed by a well known damascene process in a layer identical with the insulating film IFG and over each of the contact plugs CP. With the procedures described above, the CMIS at the first layer is formed.

Then, after forming a metal film over the CMIS at the first layer, a CMIS at the second layer is formed over the metal film. When the CMIS logic circuit is stacked, degree of freedom in the layout for the logic design such as for SRAM having the CMIS circuit can be improved.

Figure 48:
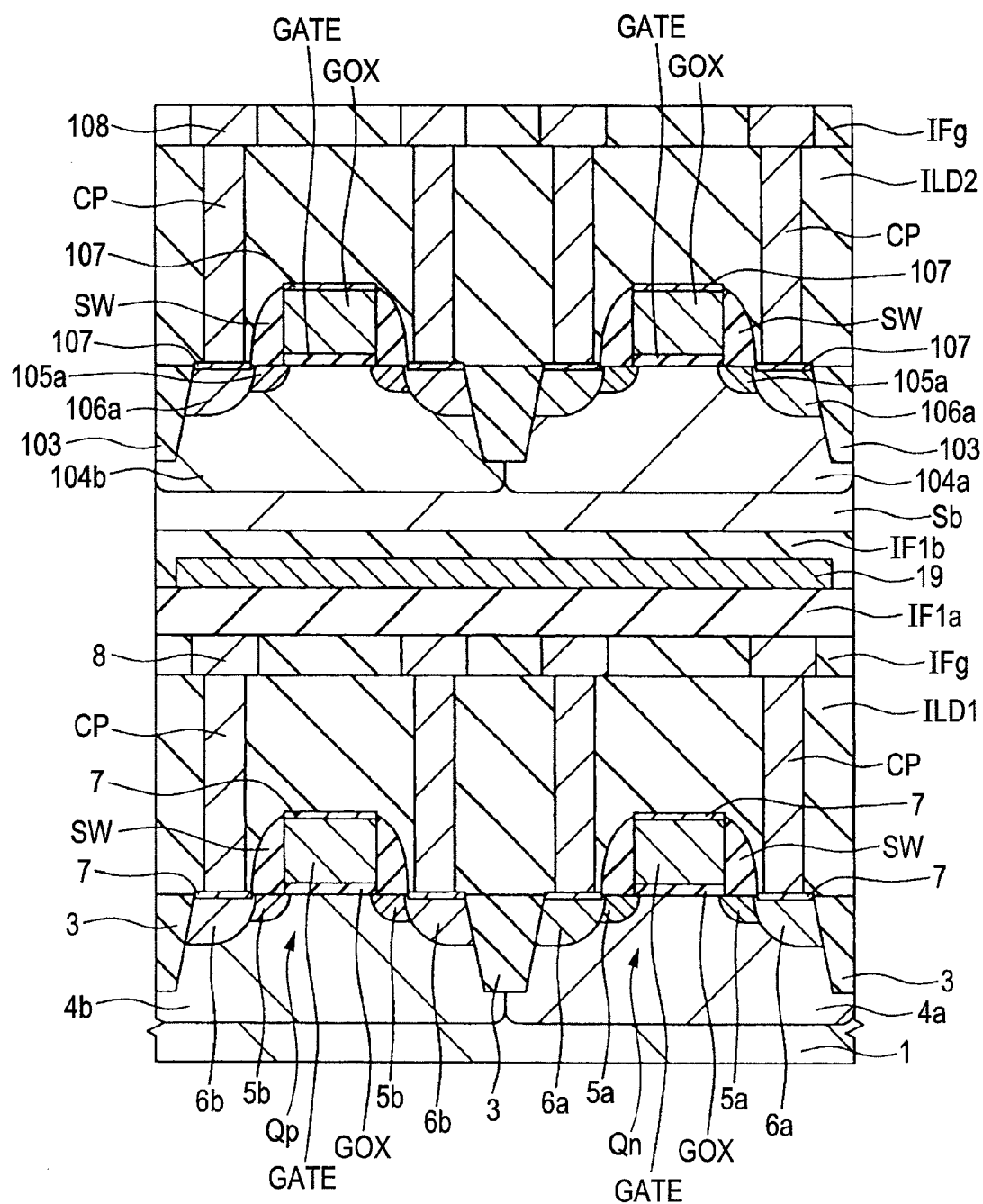
FIG. 48 is a cross sectional view for a main portion explaining the method for manufacturing the semiconductor device succeeding to FIG. 47.

That is, as shown in FIG. 48, an interlayer insulating film IF1a, a metal film 19, and an interlayer insulating film IF1b are formed over the insulating film IFg and over the metal interconnect 8 by using a CVD method and a CMP method in the same manner as in the first and second embodiments. Then, a silicon film Sb as a substrate for a CMIS at the second layer is formed. The silicon film Sb is formed by depositing silicon in an amorphous silicon state by using a CVD method and then crystallizing the same by laser annealing to form a polysilicon state. Then, by forming the CMIS at the second layer in the same method as described with reference to FIG. 41 to FIG. 47, a semiconductor device of this embodiment is completed. While only two layers are stacked for CMIS in this embodiment, more than two layers may be stacked.

In this embodiment, in the laser annealing for activating the impurity diffusion layer of the CMIS logic circuit in addition to the annealing for crystallizing the silicon film Sb, excessive heating of the CMIS in the layer below the CMIS in the layer to be annealed is prevented. In this embodiment, different from the first and second embodiments, a metal film is disposed between the CMIS at the first layer and the CMIS at the second layer not for the purpose of preventing the degradation of the characteristic regarding the heat resistance of the phase-change material but for preventing the degradation of the characteristic of the silicide layer 7 comprised of NiSi formed over the gate electrode and over the impurity diffusion layer. Since NiSi is coagulated by an excessively high temperature treatment to increase the resistance value, it is necessary to prevent the silicide layer from being heated excessively in order to prevent the degradation of the device characteristic. Further, when a high-k film is used for the gate insulating film, the characteristic of the high-k film is also degraded at a high temperature. This embodiment can prevent such degradation of the characteristic of the gate insulating film.

As has been described in this embodiment, the present invention is applicable not only to the non-volatile semiconductor memory device but also to other semiconductor devices such as an MISFET used for peripheral circuits or logic circuits formed by stacking layers having a structure where the characteristic is degraded at high temperature or having a structure where the function is lost at high temperature and does not operate normally (structural body).

Further, in this embodiment, excessive heating of the metal film 19 by the laser is prevented and excessive increase of the temperature of the CMIS at the first layer due to the heat possessed in the metal film 19 is prevented by using a material having a thermal conductivity, for example, lower than that of the contact plug CP or the metal interconnect 8 for the material of the metal film 19 shown in FIG. 41 in the same manner as in the first embodiment.

In the annealing step for the impurity diffusion layer and the annealing step upon crystallization of the silicon film Sb (refer to FIG. 48) described in this embodiment, it may be considered to use a laser at a short wavelength such as an excimer laser or a YAG laser. However, since the light at a short wavelength of such a laser shows a permeability to the oxide film, it may possibly melt the silicon film below the device isolation region (for example, the silicon film Sb and the semiconductor substrate 1 shown in FIG. 48). Further, since the laser at a short wavelength transmits the oxide film, it may possibly melt the gate electrode formed of a semiconductor material such as polysilicon. Further, this also involves a problem of generating uneven density in the pattern (gate electrode pattern) or dependence to the underlying material (for example, Si substrate, silicon oxide film). Accordingly, it is not easy to activate the impurity introduced into the semiconductor substrate for forming the source-drain region by a short wavelength laser such as an excimer laser.

While the invention made by the present inventors have been described specifically, it is apparent that the present invention is not restricted only to the embodiments described above but can be modified variously within a range not departing the gist of the invention.

The method for manufacturing the semiconductor device according to the invention is applicable generally to semiconductor devices having stacked structures of plural layers where laser annealing is adopted when respective layers are formed.

What is claimed is:

1. A semiconductor device including:
    a first structural body having a first semiconductor device formed over a first region of a semiconductor substrate,
    a metal film formed over the first structural body being insulated from the first semiconductor device, a second structural body having a second semiconductor device formed over the metal film being insulated from the metal film,
    a third structural body formed over a second region of the semiconductor substrate and having a third semiconductor device insulated from the metal film, and
    a first connection member for electrically connecting the first semiconductor device and the third structural body, and a second connection member for electrically connecting and the second semiconductor device and the third structural body,
    wherein the metal film has a thermal conductivity lower than that of the first connection member and the second connection member, and
    wherein the second semiconductor device includes:
    a plurality of first interconnects in a stripe shape extending in a first direction of the main surface of the semiconductor substrate;
    a plurality of diodes formed each at a predetermined distance over each of the first interconnects and electrically connected with the first interconnects respectively;
    a plurality of non-volatile memories formed over the diodes respective and electrically connected with the diodes; and
    a plurality of second interconnects in a stripe shape extending in a second direction perpendicular to the first direction formed over the non-volatile memories and electrically connected with the non-volatile memories, wherein each of the diodes has a columnar stacked structure where a polycrystal semiconductor layer of a first conduction type and a polycrystal semiconductor layer of a second conduction type are stacked, wherein each of the nonvolatile memories has a columnar stacked structure comprised of a first metal electrode film, a phase-change material layer, and a second metal electrode film stacked successively over the corresponding diode, and wherein the first interconnects and the second interconnects configure word lines and bit lines for selecting the non-volatile memories.

2. The semiconductor device according to claim 1, wherein the metal film is disposed at a position overlapping the first semiconductor device in a plan view.

3. The semiconductor device according to claim 1, wherein the metal film comprises a compound or an alloy of a plurality of elements.

4. The semiconductor device according to claim 1, wherein the second semiconductor device has a polysilicon film.

5. The semiconductor device according to claim 4, wherein the polysilicon film is formed by performing a heat treatment by a laser.

6. A semiconductor device including:
a first structural body having a first semiconductor device formed over a first region of a semiconductor substrate,
a metal film formed over the first structural body being insulated from the first semiconductor device,
a second structural body having a second semiconductor device formed over the metal film being insulated from the metal film,
a third structural body formed over a second region of the semiconductor substrate and having a third semiconductor device insulated from the metal film, and
a first connection member for electrically connecting the first semiconductor device and the third structural body, and a second connection member for electrically connecting and the second semiconductor device and the third structural body,
wherein the metal film has a thermal conductivity lower than that of the first connection member and the second connection member, and
wherein the second semiconductor device includes:
a first conductive film formed over the main surface of the semiconductor substrate;
a plurality of second insulating films and a plurality of second conductive films stacked alternately over the first conductive film,
wherein the second insulating films and the second conductive films have a plurality of holes reaching the upper surface of the first conductive film,
a third insulating layer, a channel semiconductor layer, and a phase-change material layer electrically connected with the first conductive film at the bottom of the holes formed successively from the side of the inner wall along the inner wall to each of the inner walls of the holes,
a plurality of second interconnects formed over the channel semiconductor layer and over the second insulating film and extending in a stripe shape in a direction along the main surface of the semiconductor substrate, and
a plurality of non-volatile memories each including portions of the second conductive films, the third insulating films, the channel semiconductor layers, and the phase-change material layer.

7. The semiconductor device according to claim 1, wherein the first semiconductor device is a non-volatile memory having a phase-change material layer.

8. A semiconductor device including:
a first structural body having a first semiconductor device formed over a first region of a semiconductor substrate,
a metal film formed over the first structural body being insulated from the first semiconductor device,
a second structural body having a second semiconductor device formed over the metal film being insulated from the metal film,
a third structural body formed over a second region of the semiconductor substrate and having a third semiconductor device insulated from the metal film, and
a first connection member for electrically connecting the first semiconductor device and the third structural body, and a second connection member for electrically connecting and the second semiconductor device and the third structural body,
wherein the metal film has a thermal conductivity lower than that of the first connection member and the second connection member, and
wherein the third semiconductor device includes:
a gate insulating film formed over the semiconductor substrate,
a gate electrode formed over the gate insulating film, and
a plurality of impurity diffusion layers formed in the main surface of the semiconductor substrate so as to sandwich the semiconductor substrate at a portion below the gate electrodes.

* * * * *